(12) United States Patent
Tai et al.

(10) Patent No.: US 12,154,964 B2
(45) Date of Patent: Nov. 26, 2024

(54) METAL GATES WITH LAYERS FOR TRANSISTOR THRESHOLD VOLTAGE TUNING AND METHODS OF FORMING THE SAME

(71) Applicant: Taiwan Semiconductor Manufacturing Company, Ltd., Hsin-Chu (TW)

(72) Inventors: An-Hung Tai, Hsinchu County (TW); Yung-Hsiang Chan, Taichung (TW); Shan-Mei Liao, Hsinchu (TW); Hsin-Han Tsai, Hsinchu (TW); Jian-Hao Chen, Hsinchu (TW); Kuo-Feng Yu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 336 days.

(21) Appl. No.: 17/531,999

(22) Filed: Nov. 22, 2021

(65) Prior Publication Data

US 2022/0328650 A1    Oct. 13, 2022

Related U.S. Application Data

(60) Provisional application No. 63/172,335, filed on Apr. 8, 2021.

(51) Int. Cl.
| | |
|---|---|
| *H01L 29/51* | (2006.01) |
| *H01L 21/8238* | (2006.01) |
| *H01L 27/092* | (2006.01) |
| *H01L 29/40* | (2006.01) |
| *H01L 29/66* | (2006.01) |

(52) U.S. Cl.
CPC .... *H01L 29/513* (2013.01); *H01L 21/823842* (2013.01); *H01L 21/823857* (2013.01); *H01L 27/0924* (2013.01); *H01L 29/401* (2013.01); *H01L 29/408* (2013.01); *H01L 29/66545* (2013.01)

(58) Field of Classification Search
CPC ..... H01L 21/823821; H01L 21/823842; H01L 21/823857; H01L 27/092; H01L 27/0924; H01L 29/0673; H01L 29/401; H01L 29/408; H01L 29/42392; H01L 29/513; H01L 29/66439; H01L 29/66545; H01L 29/775; H01L 29/78696
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |

(Continued)

*Primary Examiner* — Nelson Garces
(74) *Attorney, Agent, or Firm* — HAYNES AND BOONE, LLP

(57) ABSTRACT

A semiconductor device includes an interface layer on a substrate, a gate dielectric layer on the interface layer, and a work function metal layer on the gate dielectric layer. An interface between the interface layer and the gate dielectric layer has a concentration of a dipole-inducing element. The semiconductor device also includes an oxygen blocking layer on the work function metal layer and a metal fill layer on the oxygen blocking layer.

20 Claims, 30 Drawing Sheets

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,868,013 B2 | 12/2020 | Tsai et al. |
| 2013/0285116 A1 | 10/2013 | Lochtefeld et al. |
| 2019/0333769 A1* | 10/2019 | Chen ................ H01L 29/66545 |
| 2020/0119019 A1* | 4/2020 | Tsai ................ H01L 21/823871 |
| 2020/0328213 A1* | 10/2020 | Cheng ............... H01L 21/02068 |
| 2021/0057216 A1* | 2/2021 | Peng ................ H01L 21/28185 |
| 2021/0082706 A1* | 3/2021 | Yu ................... H01L 21/823807 |

\* cited by examiner

METAL GATES WITH LAYERS FOR TRANSISTOR THRESHOLD VOLTAGE TUNING AND METHODS OF FORMING THE SAME

PRIORITY DATA

This application claims priority to U.S. Provisional Patent Application No. 63/172,335 filed on Apr. 8, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

An IC device includes transistors in different regions (or areas) that serve different functions. These different functions may require the transistors to have different threshold voltages. For example, I/O functions and core functions may prefer different threshold voltages to support low-leakage and high-speed applications, respectively. At the same time, it is advantageous to have similar processes and similar process windows to fabricate these different transistors to reduce cost and improve yield. Although existing multiple gate filed-effect transistors and processes are generally adequate for their intended purposes, they have not been entirely satisfactory in every aspect. How to continuously scale down gate stacks for devices in different regions with a wide threshold voltage tuning range is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
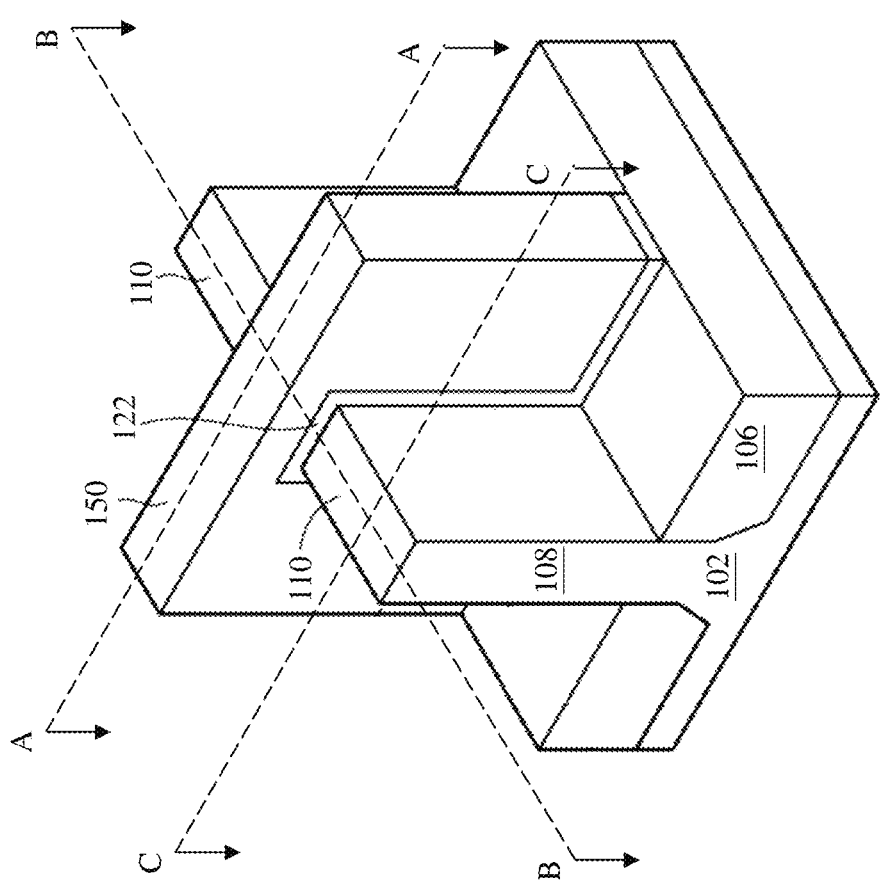
FIG. 1 illustrates an example of a FinFET in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to tuning threshold voltages of transistors in different regions of an integrate circuit (IC). In accordance with some embodiments, a doping layer is formed on a gate dielectric layer, and dipole-inducing elements (e.g., Al, Ti, Zr, Hf, Mg, Ge, Y, Lu, La, Sr, etc.) from the doping layer are driven through the gate dielectric layer by an annealing process, resulting in dipoles at the interface between the interface layer and the gate dielectric layer. The doping layer is then removed. A work function metal layer is formed on the gate dielectric layer and an oxygen blocking layer is thereafter formed on the work function metal layer. By forming the oxygen blocking layer, oxygen atoms from ambient environment are blocked from diffusing to where the dipole interfaces are formed. Thus, a density of the dipoles won't be impaired by the diffusing oxygen atoms. The threshold voltages of subsequently formed devices may be controlled.

FIG. 1 illustrates an example of a FinFET in a three-dimensional view, in accordance with some embodiments. The FinFET comprises a fin 108 on a substrate 102. Isolation regions 106 are formed on the substrate 102, and the fin 108 protrudes above and from between neighboring isolation regions 106. A gate dielectric layer 122 is along sidewalls and over a top surface of the fin 108, and a gate electrode 150 is over the gate dielectric layer 122. Source/drain regions 110 are disposed in opposite sides of the fin 108 with respect to the gate dielectric layer 122 and gate electrode 150. FIG. 1 further illustrates reference cross-sections that are used in later figures. Cross-section A-A is across a channel, gate dielectric layer 122, and gate electrode 150 of the FinFET. Cross-section B-B is perpendicular to cross-section A-A and is along a longitudinal axis of the fin 108 and in a direction of, for example, a current flow between the source/drain regions 110. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in other types of multi-gate devices, such as gate-all-around (GAA) FETs, or planar devices, such as planar FETs.

FIGS. 2-6 are cross-sectional views of intermediate stages in the manufacturing of FinFETs, in accordance with some embodiments. FIGS. 2-6 are shown along reference cross-section A-A illustrated in FIG. 1, except for multiple fins/FinFETs.

Figure 2:
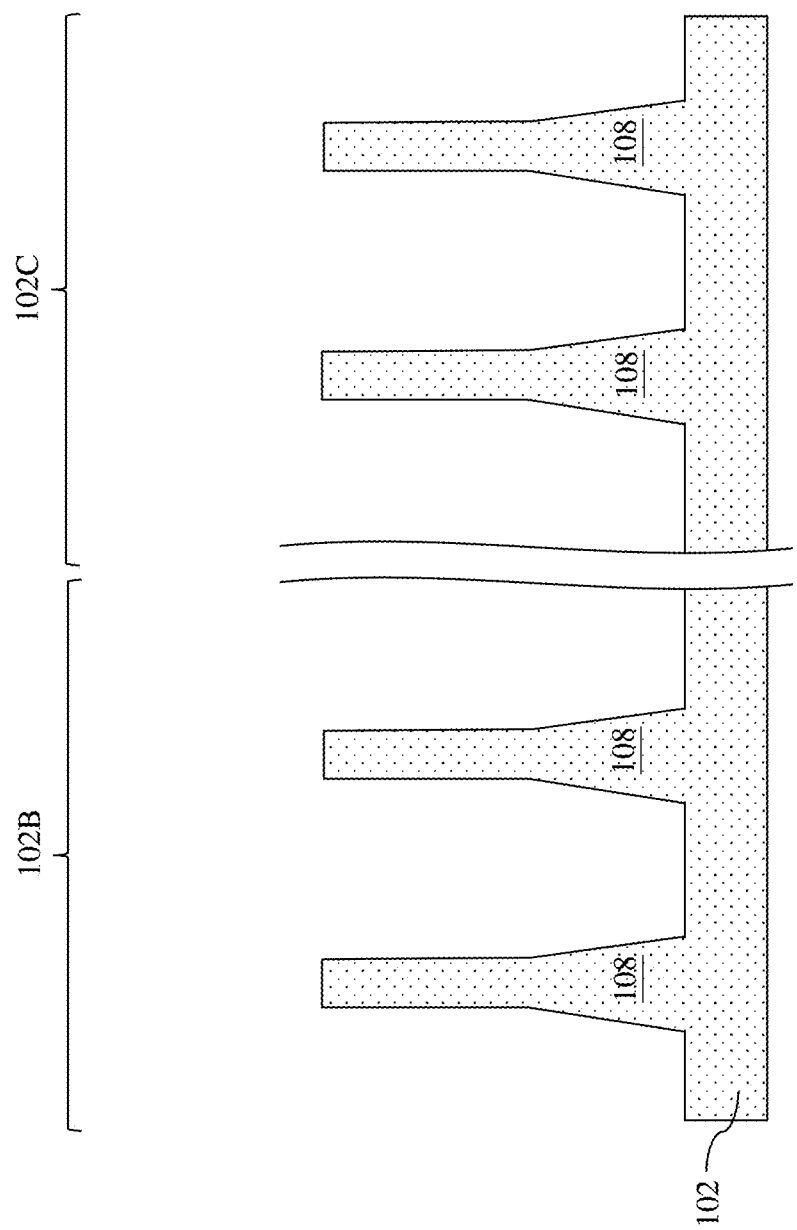
FIGS. 2, 3, 4, 5, 6, 7, 8, 9A, 9B, 10, 11, 12, 13, 14, 15, 16, 17, 18, 20, 21, 22, and 23 are cross-sectional views of intermediate stages in the manufacturing of FinFETs, in accordance with some embodiments.

In FIG. 2, fins 108 are formed in a substrate 102. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 102 has a region 102B and a region 102C. The region 102B can be for forming n-type devices, such as NMOS transistors, e.g., n-type FinFETs. The region 102C can be for forming p-type devices, such as PMOS transistors, e.g., p-type FinFETs. The region 102B may be physically separated from the region 102C (as illustrated by a divider), and any number of device features (e.g., other active devices, doped regions, isolation structures, etc.) may be disposed between the region 102B and the region 102C. In some embodiments, both the region 102B and the region 102C are used to form the same type of devices, such as both regions being for n-type devices or p-type devices.

The fins 108 are semiconductor strips. In some embodiments, the fins 108 may be formed in the substrate 102 by etching trenches in the substrate 102. The etching may be any acceptable etch process, such as a reactive ion etch (RIE), neutral beam etch (NBE), the like, or a combination thereof. The etch may be anisotropic.

Figure 3:
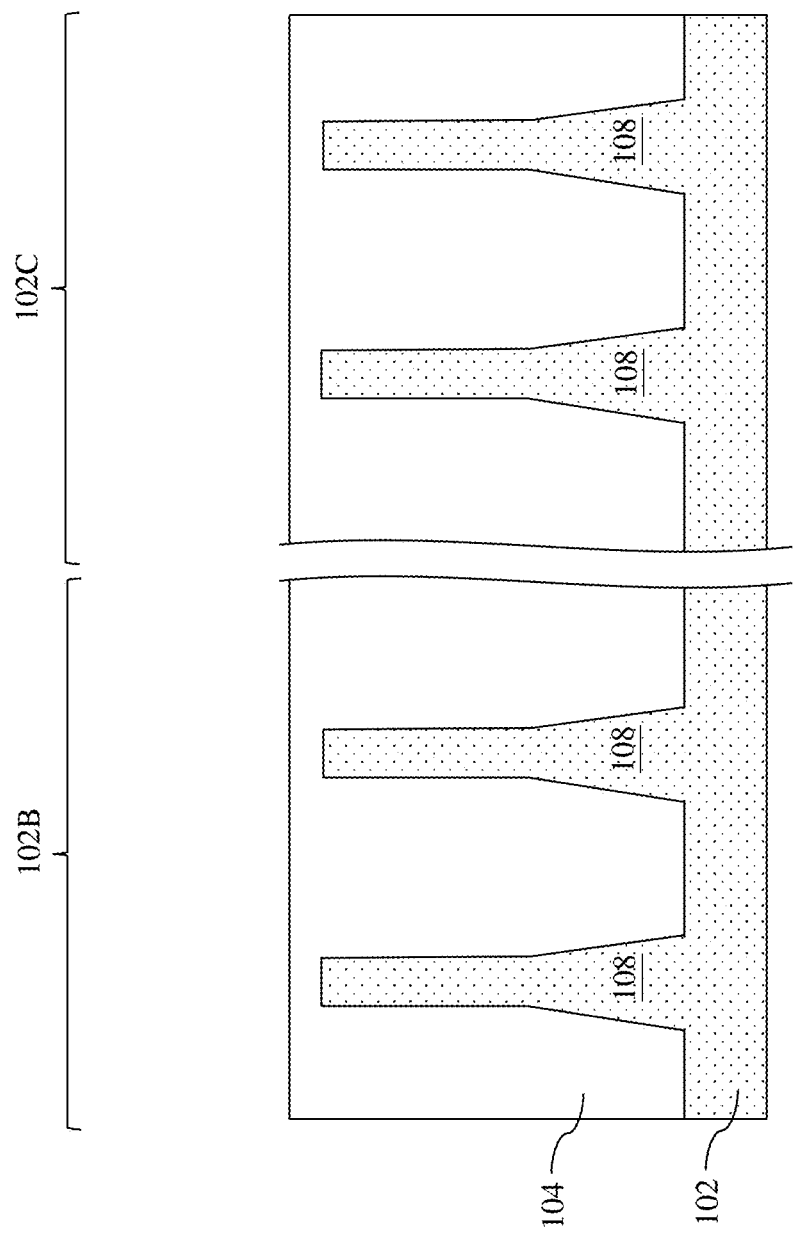

In FIG. 3, an insulation material 104 is formed over the substrate 102 and between neighboring fins 108. The insulation material 104 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 104 is silicon oxide formed by a FCVD process. An anneal process may be performed once the insulation material is formed. In an embodiment, the insulation material 104 is formed such that excess insulation material covers the fins 108.

Figure 4:
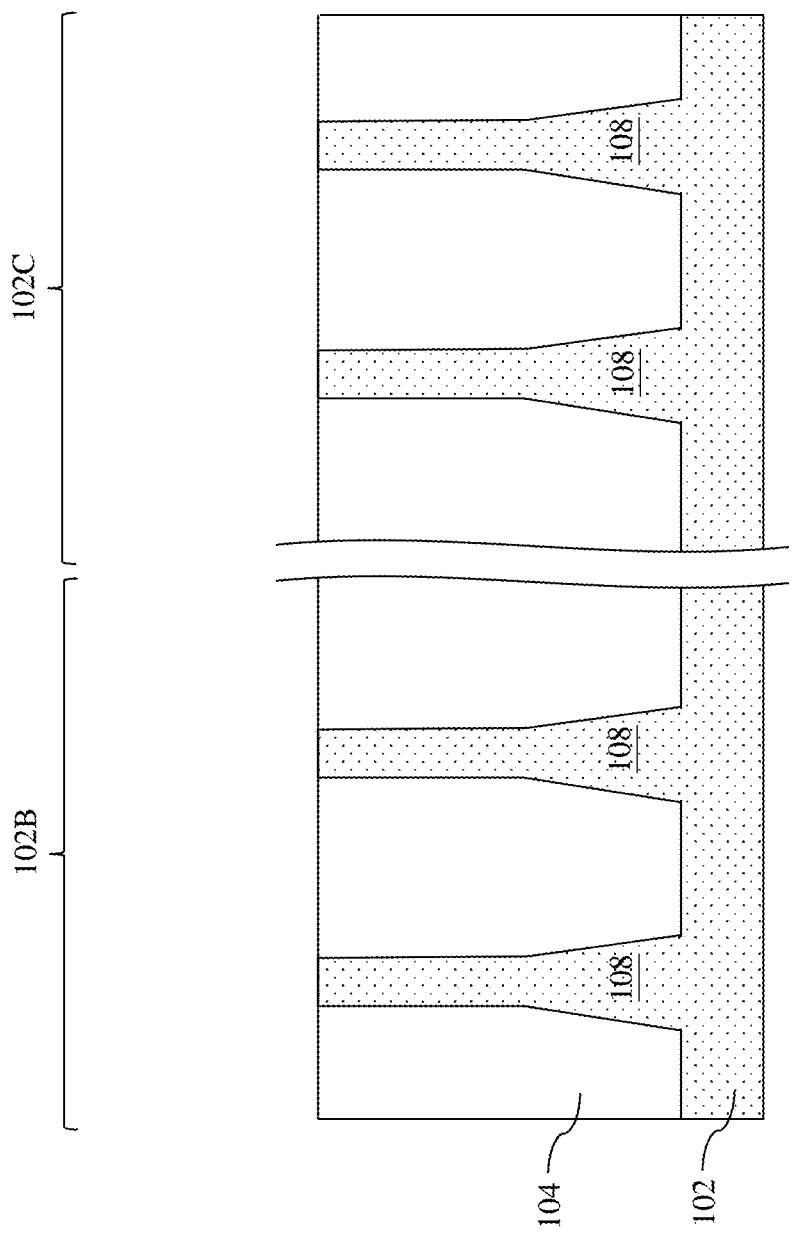

In FIG. 4, a planarization process is applied to the insulation material 104. In some embodiments, the planarization process includes a chemical mechanical polish (CMP), an etch back process, combinations thereof, or the like. The planarization process exposes the fins 108. Top surfaces of the fins 108 and the insulation material 104 are level after the planarization process is complete.

Figure 5:
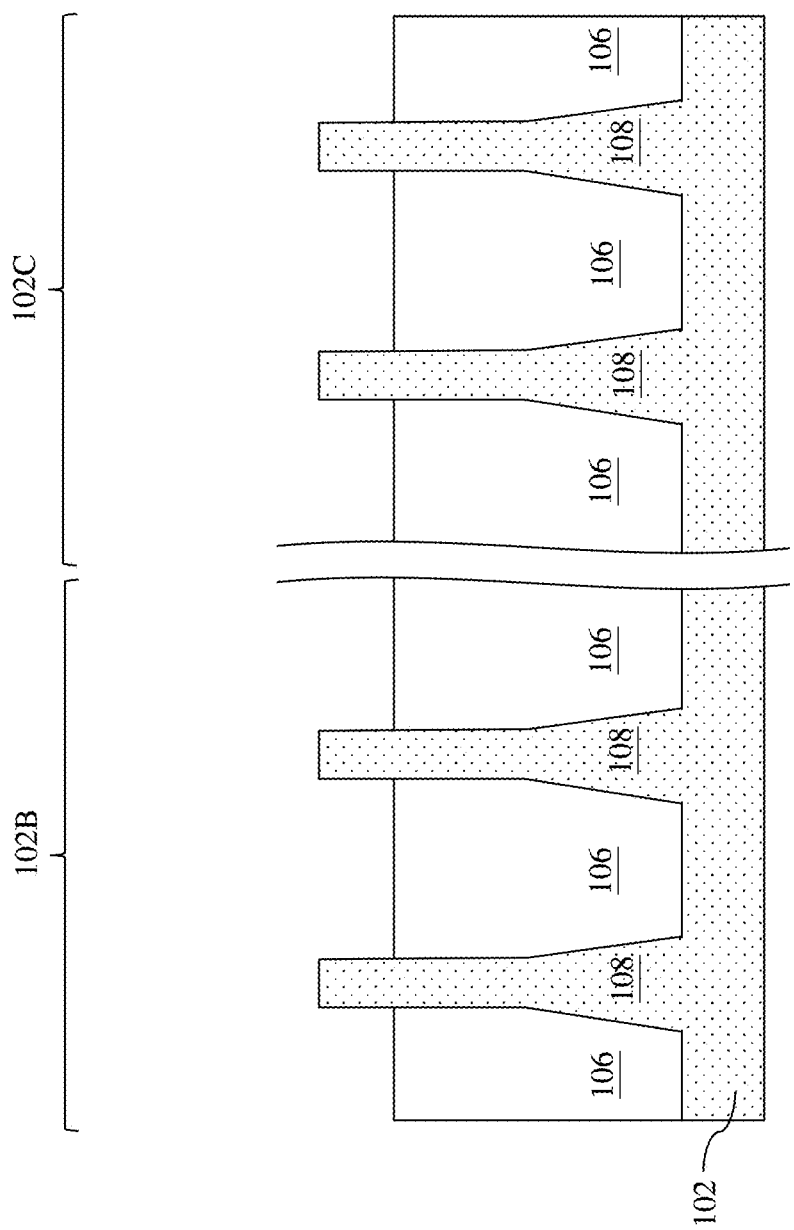

In FIG. 5, the insulation material 104 is recessed to form Shallow Trench Isolation (STI) regions 106. The insulation material 104 is recessed such that fins 108 in the region 102B and in the region 102C protrude from between neighboring STI regions 106. Further, the top surfaces of the STI regions 106 may have a flat surface as illustrated, a convex surface, a concave surface (such as dishing), or a combination thereof. The top surfaces of the STI regions 106 may be formed flat, convex, and/or concave by an appropriate etch. The STI regions 106 may be recessed using an acceptable etching process, such as one that is selective to the material of the insulation material 104. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 108 may be formed. In some embodiments, a dielectric layer can be formed over a top surface of the substrate 102; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins. For example, the fins in FIG. 4 can be recessed, and a material different from the substrate 102 may be epitaxially grown in their place. In an even further embodiment, a dielectric layer can be formed over a top surface of the substrate 102; trenches can be etched through the dielectric layer; heteroepitaxial structures can be epitaxially grown in the trenches using a material different from the substrate 102; and the dielectric layer can be recessed such that the heteroepitaxial structures protrude from the dielectric layer to form the fins 108. In some embodiments where homoepitaxial or heteroepitaxial structures are epitaxially grown, the grown materials may be in situ doped during growth, which may obviate prior and subsequent implantations although in-situ and implantation doping may be used together. Still further, it may be advantageous to epitaxially grow a material in an NMOS region different from the material in a PMOS region. In various embodiments, the fins 108 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate doped regions (not shown, sometimes referred to as well regions) may be formed in the fins 108 and/or the substrate 102. In some embodiments, a P-type doped region may be formed in the region 50B, and an N-type doped region may be formed in the region 102C. In some embodiments, only P-type or only N-type doped regions are formed in both the region 102B and the region 102C.

In the embodiments with different types of doped regions, the different implant steps for the region 102B and the region 102C may be achieved using a photoresist or other masks (not shown). For example, a photoresist may be formed over the fins 108 and the STI regions 106 in the region 102B. The photoresist is patterned to expose the region 102C of the substrate 102, such as a PMOS region. The photoresist can be formed by using a spin-on technique and can be patterned using acceptable photolithography techniques. Once the photoresist is patterned, an n-type impurity implant is performed in the region 102C, and the photoresist may act as a mask to substantially prevent n-type impurities from being implanted into the region 102B, such as an NMOS region. The n-type impurities may be phosphorus, arsenic, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist is removed, such as by an acceptable ashing process. Following the implanting of the region 102C, a photoresist is formed over the fins 108 and the STI regions 106 in the region 102C. The photoresist is patterned to expose the region 102B of the substrate 102, such as the NMOS region. The photoresist can be formed by using a spin-on technique and can be patterned using acceptable photolithography techniques. Once the photoresist is patterned, a p-type impurity implant may be performed in the region 102B, and the photoresist may act as a mask to substantially prevent p-type impurities from being implanted into the region 102C, such as the PMOS region. The p-type impurities may be boron, BF$_2$, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist may be removed, such as by an acceptable ashing process. After the implants of the region 102B and the region 102C, an anneal may be performed to activate the p-type and/or n-type impurities that were implanted. In some embodiments, the grown materials of epitaxial fins may be in-situ doped during growth, which may obviate the implantations, although in-situ and implantation doping may be used together.

Figure 6:
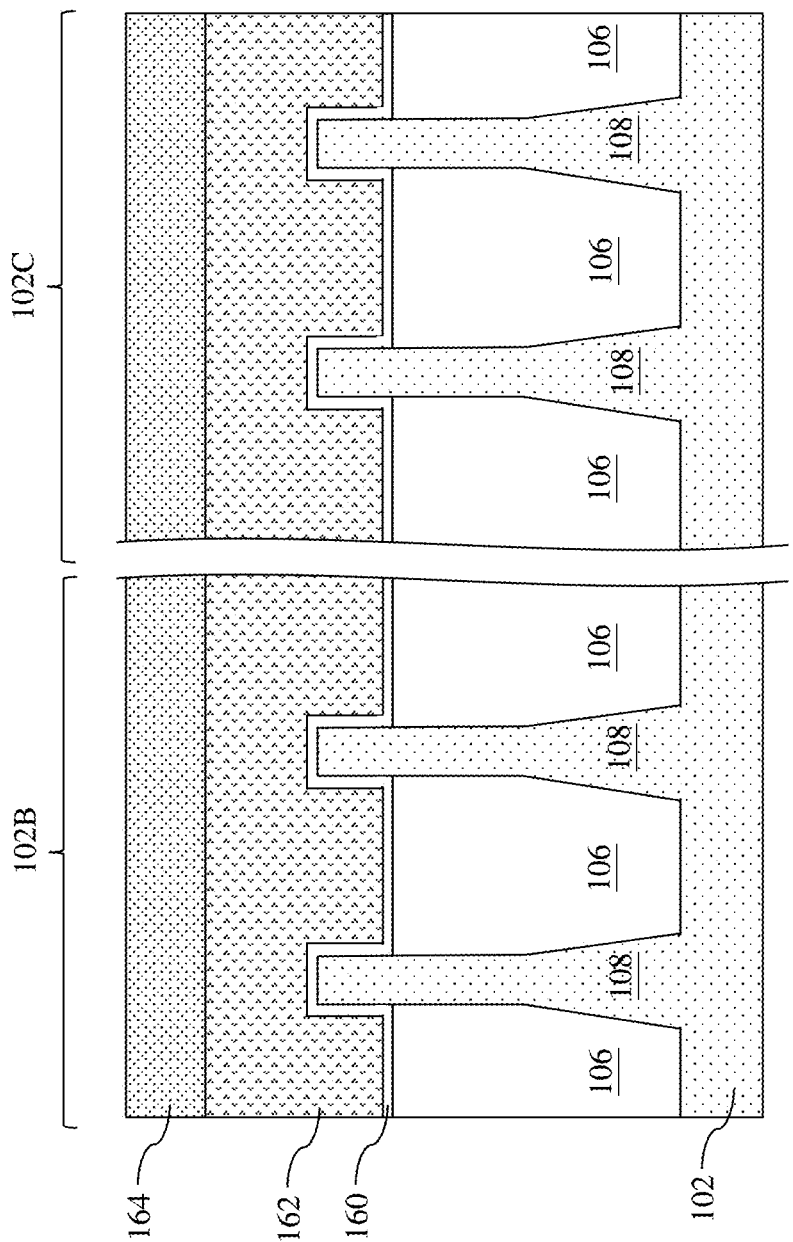

In FIG. 6, a dummy dielectric layer 160 is formed over the fins 108. The dummy dielectric layer 160 may be, for example, silicon oxide, silicon nitride, a combination thereof, or the like, and may be deposited or thermally grown according to acceptable techniques. A dummy gate layer 162 is formed over the dummy dielectric layer 160, and a mask layer 164 is formed over the dummy gate layer 162. The dummy gate layer 162 may be deposited over the dummy dielectric layer 160 and then planarized, such as by a CMP. The dummy gate layer 162 may be a conductive material and may be selected from a group including polycrystalline-silicon (poly silicon), polycrystalline silicon-germanium (poly-SiGe), metallic nitrides, metallic silicides, metallic oxides, and metals. In one embodiment, amorphous silicon is deposited and recrystallized to create poly silicon. The dummy gate layer 162 may be deposited by physical vapor deposition (PVD), CVD, sputter deposition, or other techniques known and used in the art for depositing conductive materials. The dummy gate layer 162 may be made of other materials that have a high etching selectivity from the etching of isolation regions. The mask layer 164 may be deposited over the dummy gate layer 162. The mask layer 164 may include, for example, SiN, SiON, or the like. In this example, a single dummy gate layer 162 and a single mask layer 164 are formed across the region 102B and the region 102C. In some embodiments, separate dummy gate layers may be formed in the region 102B and the region 102C, and separate mask layers may be formed in the region 102B and the region 102C.

FIGS. 7-18 and 20-23 are cross-sectional views of intermediate stages in the manufacturing of FinFETs, in accordance with some embodiments. FIGS. 7-9A, 10-18, and 20-23 are shown along reference cross-section B-B illustrated in FIG. 1, except for multiple fins/FinFETs. FIG. 9B is shown along reference cross-section C-C illustrated in FIG. 1, except for multiple fins/FinFETs. FIGS. 7-9A, 10-18, and 20-23 illustrate a region 108B and a region 108C of one or more of the fins 108. The regions 108B and 108C may be in the same fin 108 or different fins 108. That is regions, 108B and 108C may both be in the region 102B (e.g., an NMOS region) or both in the region 102C (e.g., a PMOS region), or one in the region 102B and another in the region 102C. Devices in the different regions 108B and 108C are formed to have different threshold voltages.

Figure 7:
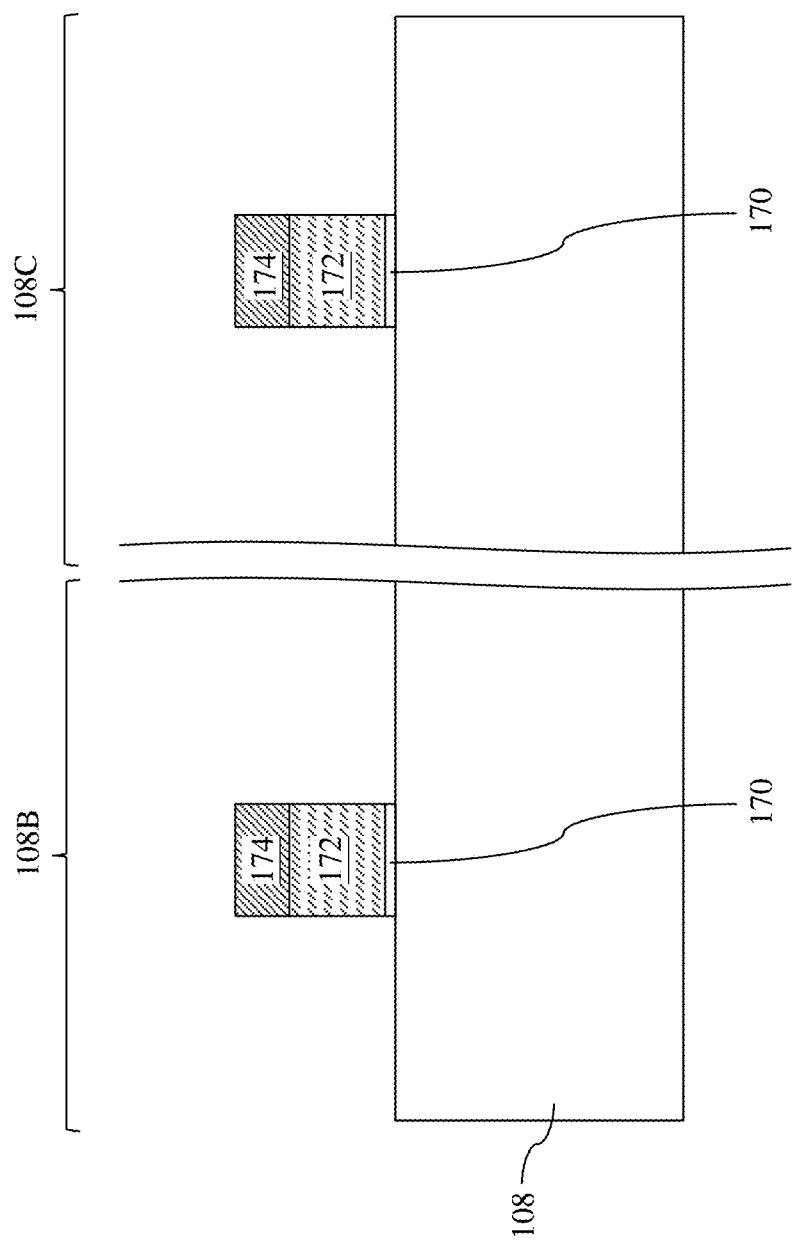

In FIG. 7, the mask layer 164 (FIG. 6) is patterned using acceptable photolithography and etching techniques to form masks 174. The pattern of the masks 174 then may be transferred to the dummy gate layer 162 and the dummy dielectric layer 160 by an acceptable etching technique to, respectively, form dummy gates 172 and dummy gate dielectric layers 170. The dummy gates 172 and dummy gate dielectric layers 170 cover respective channel regions of the fins 108. The pattern of the masks 174 may be used to physically separate each of the dummy gates 172 from adjacent dummy gates. The dummy gates 172 may also have a lengthwise direction substantially perpendicular to the lengthwise direction of respective fins 108.

Figure 8:
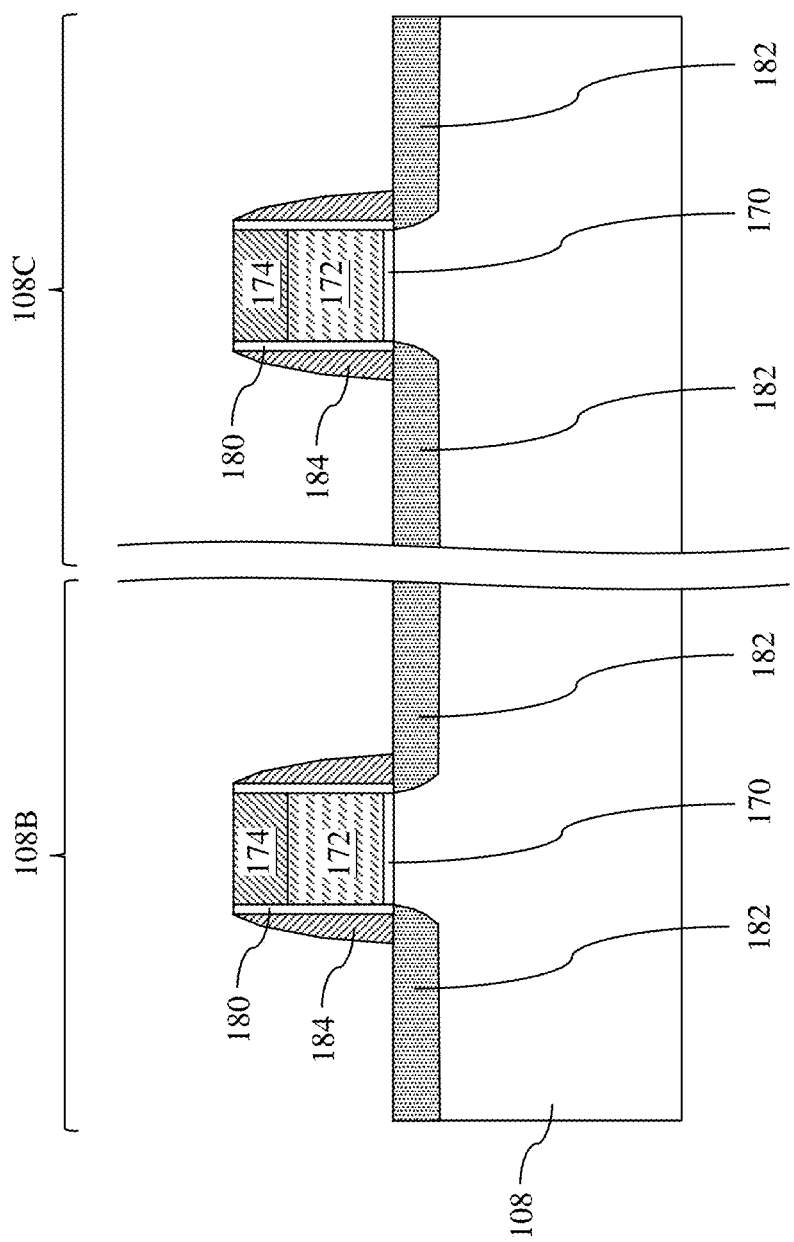

In FIG. 8, gate seal spacers 180 can be formed on exposed surfaces of the dummy gates 172 and/or the fins 108. A thermal oxidation or a deposition followed by an anisotropic etch may form the gate seal spacers 180. In some embodiments, the gate seal spacers 180 may be formed of a nitride, such as silicon nitride, silicon oxynitride, silicon carbide, silicon carbonitride, the like, or a combination thereof. The gate seal spacers 180 seal the sidewalls of subsequently formed gate stacks, and may act as additional gate spacing layers.

Further, implants for lightly doped source/drain (LDD) regions 182 may be performed. In the embodiments with different device types, similar to the implants discussed above in FIG. 5, a mask, such as a photoresist, may be formed over the first region 108B, while exposing the second region 108C, and appropriate type (e.g., n-type or p-type) impurities may be implanted into the exposed fins 108 in the second region 108C. The mask may then be removed. Subsequently, a mask, such as a photoresist, may be formed over the second region 108C while exposing the first region 108B, and appropriate type impurities may be implanted into the exposed fins 108 in the first region 108B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate spacers 184 are formed on the gate seal spacers 180 along sidewalls of the dummy gates 172 and over the LDD regions 182. The gate spacers 184 may be formed by conformally depositing a material and subsequently anisotropically etching the material. The material of the gate spacers 184 may be silicon nitride, SiCN, a combination thereof, or the like. The etch may be selective to the material of the gate spacers 184, such that the LDD regions 182 are not etched during the formation of the gate spacers 184.

Figure 9A:
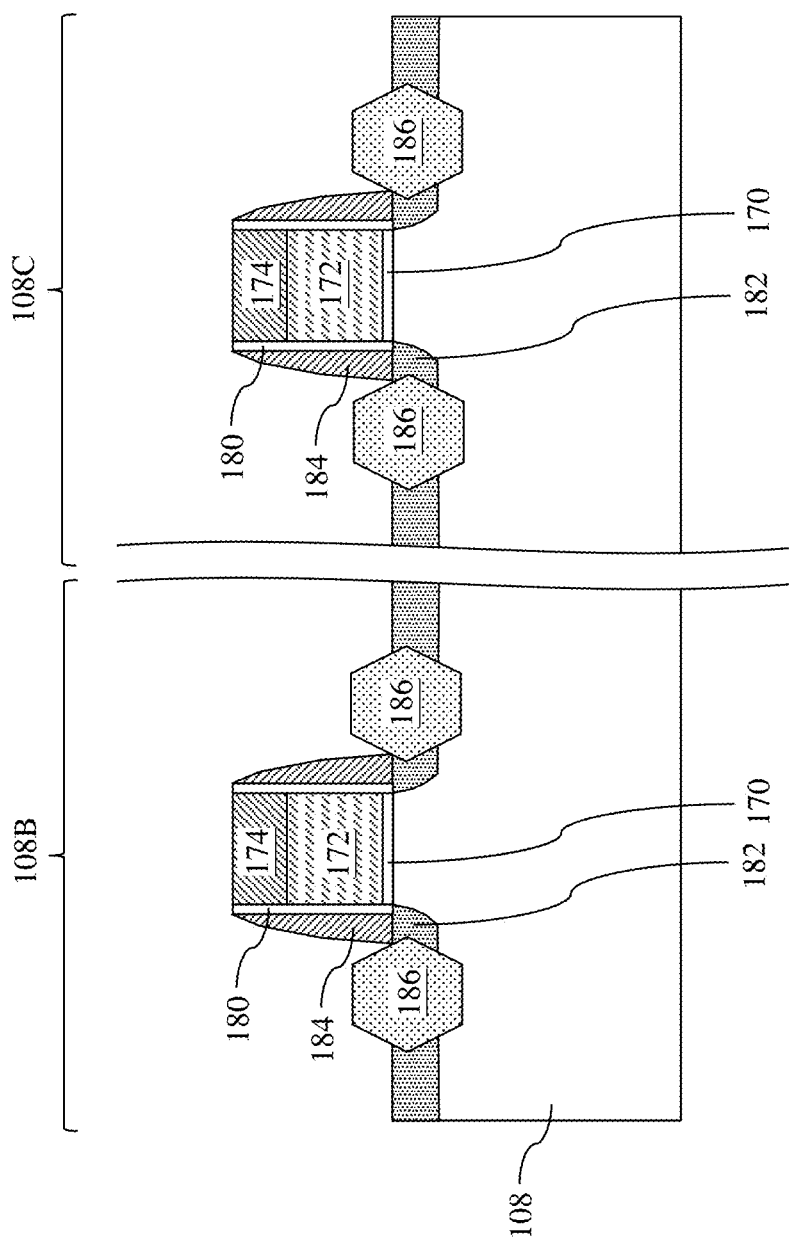
Figure 9B:
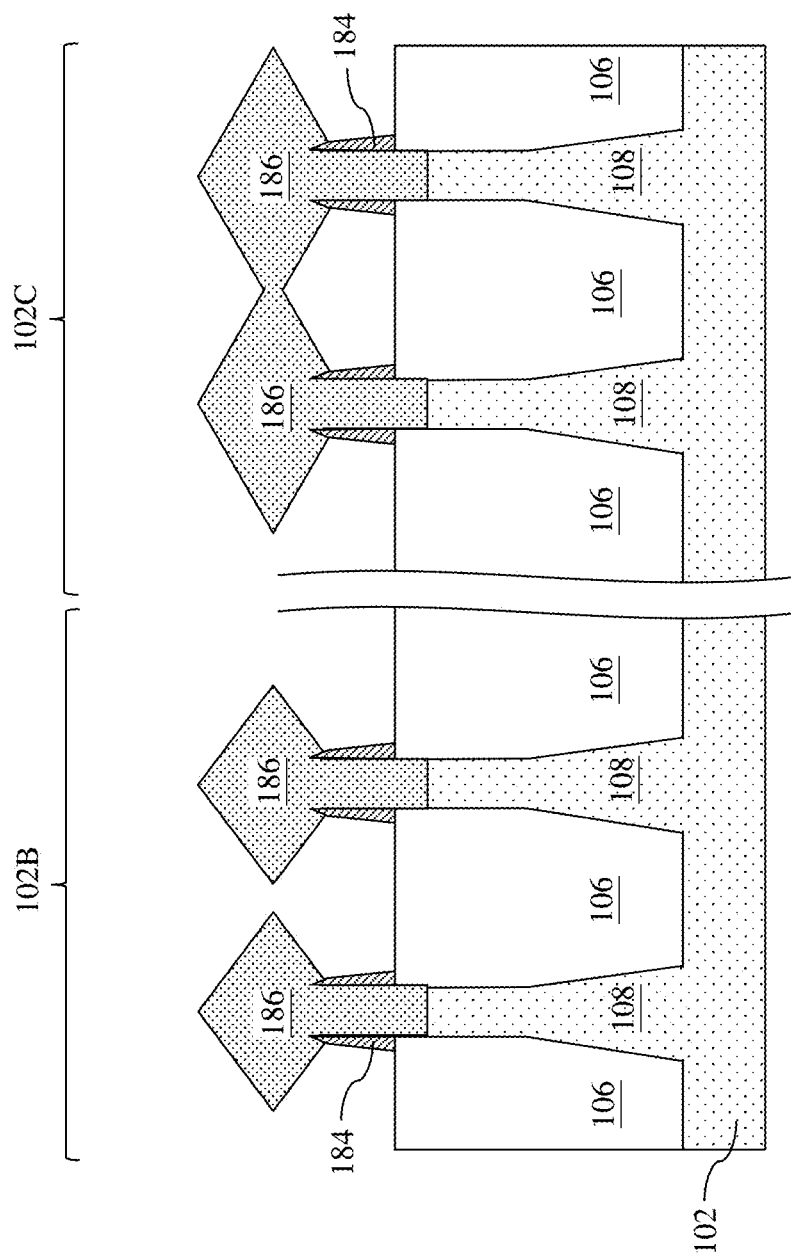

Referring to FIG. 9A, epitaxial source/drain regions 186 are formed in the fins 108. The epitaxial source/drain regions 186 are formed in the fins 108 such that each dummy gate 172 is disposed between respective neighboring pairs of the epitaxial source/drain regions 186. In some embodiments, the epitaxial source/drain regions 186 may extend through the LDD regions 182. In some embodiments, the gate seal spacers 180 and gate spacers 184 are used to separate the epitaxial source/drain regions 186 from the dummy gates 172 by an appropriate lateral distance so that the epitaxial source/drain regions 186 do not short out subsequently formed gates of the resulting FinFETs.

Referring to FIG. 9B, the epitaxial source/drain regions 186 in the region 102B (e.g., an NMOS region) may be formed by masking the region 102C (e.g., a PMOS region), and etching source/drain regions of the fins 108 in the region 102B to form recesses in the fins 108. Then, the epitaxial source/drain regions 186 in the region 102B are epitaxially grown in the recesses. The epitaxial source/drain regions 186 may include any acceptable material, such as appropriate for n-type FinFETs. For example, if the fins 108 are silicon, the epitaxial source/drain regions 186 in the region 102B may include silicon, SiC, SiCP, SiP, or the like. The epitaxial source/drain regions 186 in the region 102B may have surfaces raised from respective surfaces of the fins 108 and may have facets.

The epitaxial source/drain regions 186 in the region 102C (e.g., a PMOS region) may be formed by masking the region 102B (e.g., an NMOS region) and etching source/drain regions of the fins 108 in the region 102C to form recesses in the fins 108. Then, the epitaxial source/drain regions 186 in the region 102C are epitaxially grown in the recesses. The epitaxial source/drain regions 186 may include any acceptable material, such as appropriate for p-type FinFETs. For example, if the fins 108 are silicon, the epitaxial source/drain regions 186 in the region 102C may comprise SiGe, SiGeB, Ge, GeSn, or the like. The epitaxial source/drain regions 186 in the region 102C may also have surfaces raised from respective surfaces of the fins 108 and may have facets.

The epitaxial source/drain regions 186 are in-situ doped during growth to form source/drain regions. The epitaxial source/drain regions 186 have the same doping type as the respective LDD regions 182, and may be doped with the same dopants or different dopants. The epitaxial source/drain regions 186 may have an impurity concentration of between about $10^{19}$ cm$^{-3}$ and about $10^{21}$ cm$^{-3}$. The n-type and/or p-type impurities for source/drain regions may be any of the impurities previously discussed. Because the epitaxial source/drain regions 186 are in-situ doped during growth, they are not doped by implantation. However, the doping profile and concentration of the LDD regions 182 produced according to some embodiments may be similar to that which would be produced if the epitaxial source/drain regions 186 were doped by implantation. Improving the doping profile and concentration of the LDD regions 182 may improve the performance and reliability of the resulting semiconductor devices.

As a result of the epitaxy processes used to form the epitaxial source/drain regions 186 in the region 102B and the region 102C, upper surfaces of the epitaxial source/drain regions have facets which expand laterally outward beyond sidewalls of the fins 108. In some embodiments, these facets cause adjacent epitaxial source/drain regions 186 of a same FinFET to merge, as illustrated by the epitaxial source/drain regions 186 for p-type FinFETs in the region 102C. Alternatively, for n-type FinFETs in the region 102B, adjacent epitaxial source/drain regions 186 may remain separated after the epitaxy process is completed.

Figure 10:
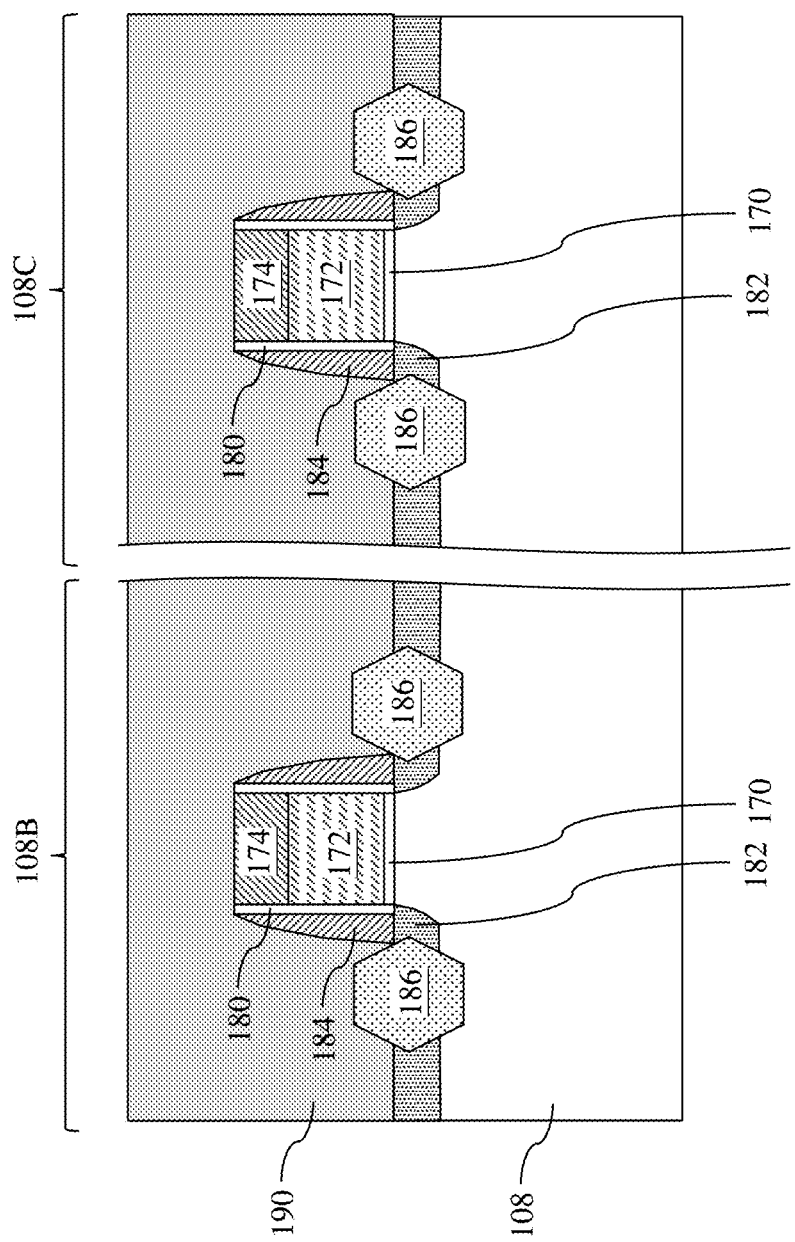

In FIG. 10, an interlayer dielectric (ILD) 190 is deposited over the fins 108. The ILD 190 may be formed of a dielectric material or a semiconductor material, and may be deposited by any suitable method, such as CVD, plasma-enhanced CVD (PECVD), or FCVD. Dielectric materials may include phospho-silicate glass (PSG), boron-silicate glass (BSG), boron-doped phospho-silicate glass (BPSG), undoped Silicate Glass (USG), or the like. Semiconductor materials may include amorphous silicon (a-Si), silicon germanium ($Si_xGe_{1-x}$, where x can be between approximately 0 and 1), pure germanium, or the like. Other insulation or semiconductor materials formed by any acceptable process may be used. In some embodiments, a contact etch stop layer (CESL), not illustrated, is disposed between the ILD 190 and the epitaxial source/drain regions 186, the gate spacers 184, the gate seal spacers 180, and the masks 174.

Figure 11:
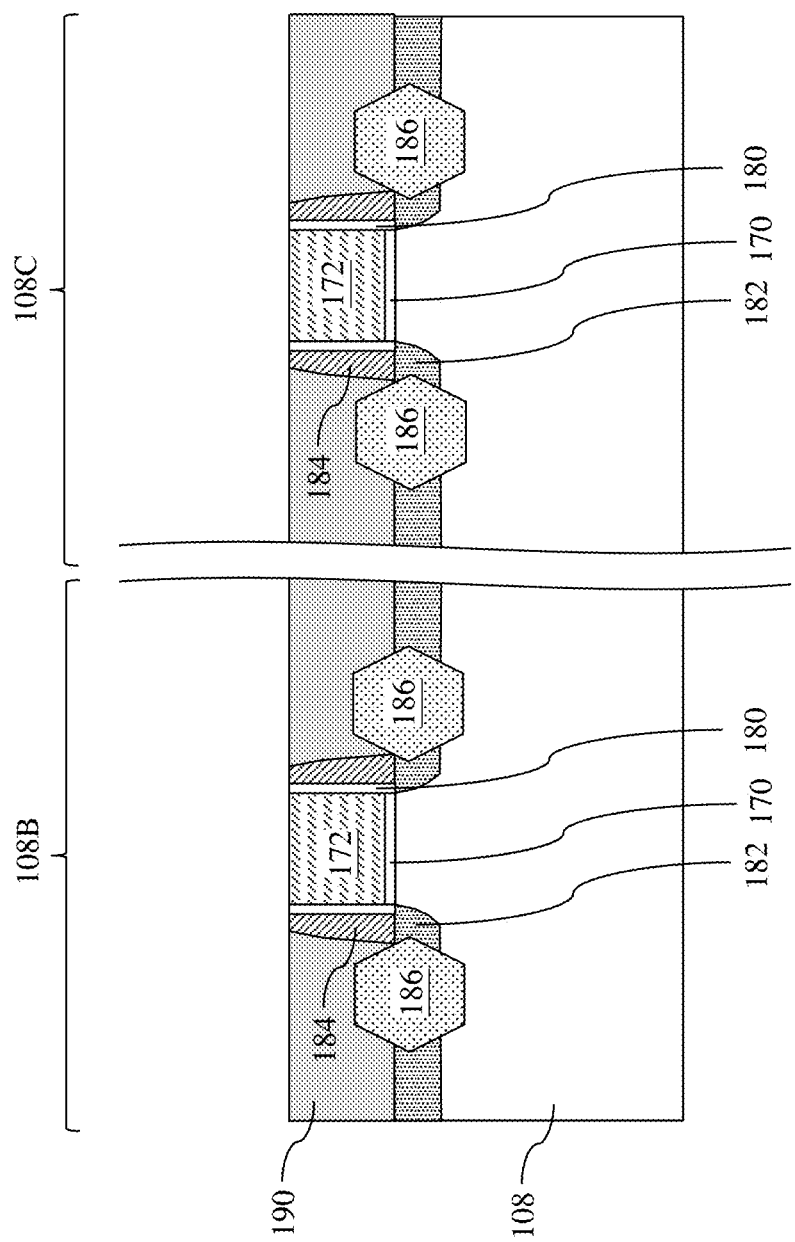

In FIG. 11, a planarization process, such as a CMP, may be performed to level the top surface of the ILD 190 with the top surfaces of the dummy gates 172. The planarization process may also remove the masks 174 on the dummy gates 172, and portions of the gate seal spacers 180 and the gate spacers 184 along sidewalls of the masks 174. After the planarization process, top surfaces of the dummy gates 172, the gate seal spacers 180, the gate spacers 184, and the ILD 190 are level. Accordingly, the top surfaces of the dummy gates 172 are exposed through the ILD 190.

Figure 12:
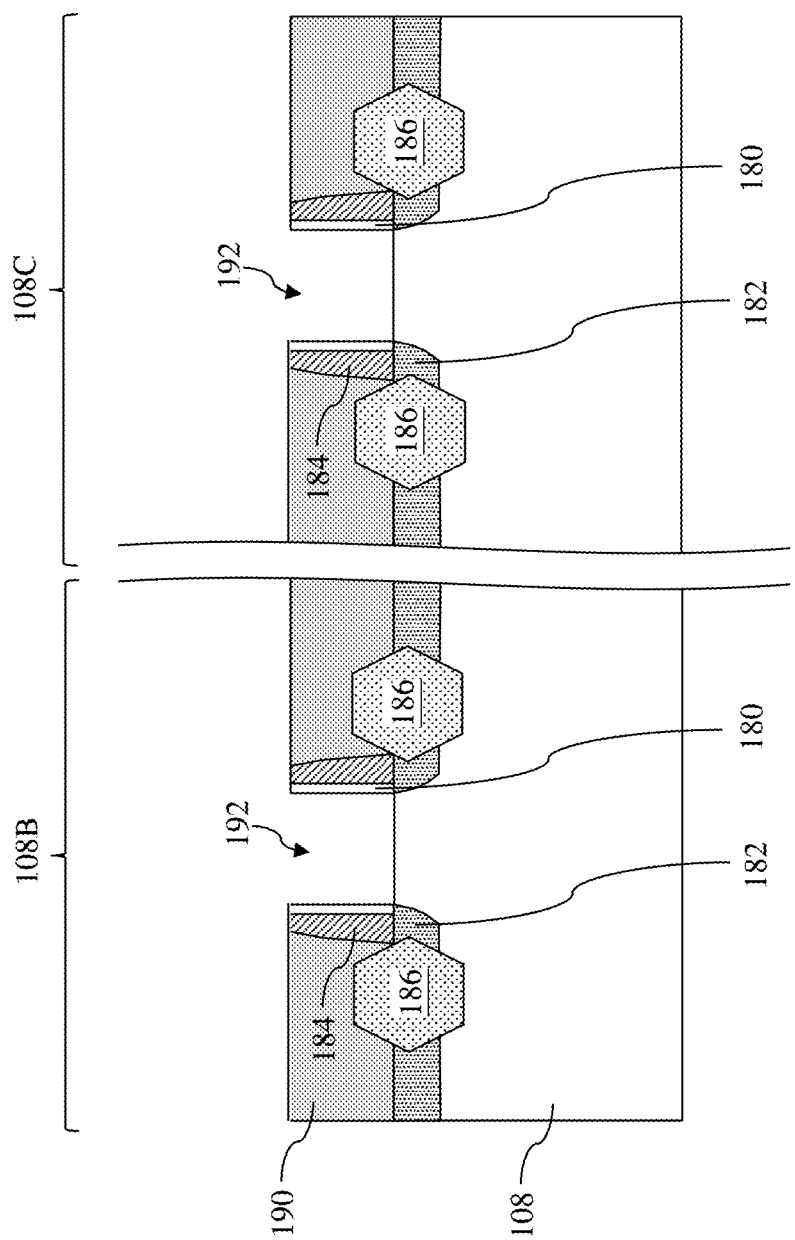

In FIG. 12, the dummy gates 172 and portions of the dummy gate dielectric layers 170 directly underlying the exposed dummy gates 172 are removed in an etching step(s), so that recesses 192 are formed. In some embodiments, the dummy gates 172 are removed by an anisotropic dry etch process. For example, the etching process may include a dry etch process using reaction gas(es) that selectively etch the dummy gates 172 without etching the ILD 190, the gate spacers 184, or the gate seal spacers 180. Each recess 192 exposes a channel region of a respective fin 108. Each channel region is disposed between neighboring pairs of the epitaxial source/drain regions 186. During the removal, the dummy gate dielectric layers 170 may be used as an etch stop layer when the dummy gates 172 are etched. The dummy gate dielectric layers 170 may then be removed after the removal of the dummy gates 172.

Figure 13:
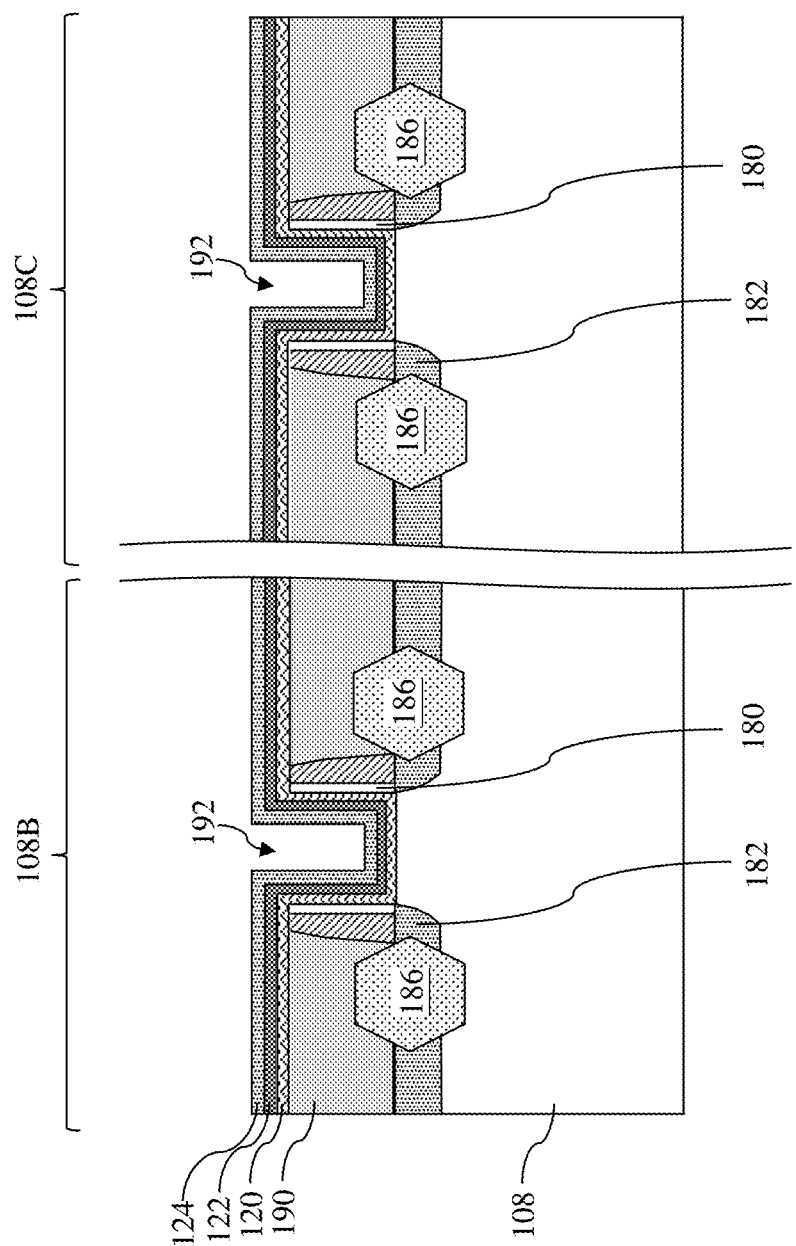

In FIG. 13, an interface layer 120 is formed in the recesses 192. The interface layer 120 is conformally formed over the fin 108, and thus the interface layer 120 lines sidewalls and the bottom surface of the recesses 192. The interface layer 120 may also cover the upper surface of the ILD 190. In accordance with some embodiments, the interface layer 120 is an oxide of the material of the fin 108, and may be formed by, e.g., oxidizing the fins 108 in the recesses 192. The interface layer 120 may also be formed by a deposition process, such as a chemical vapor deposition (CVD) process, a physical vapor deposition (PVD) process, an atomic layer deposition (ALD) process, or the like.

Further, a gate dielectric layer 122 is formed over the interface layer 120. The gate dielectric layer 122 may be deposited conformally in the recesses 192, such as on the top surfaces and the sidewalls of the fins 108 and on sidewalls of the interface layer 120 in the recesses 192. The gate dielectric layer 122 may also be formed along top surfaces of the ILD 190. In accordance with some embodiments, the gate dielectric layer 122 is a high-k dielectric material having a k value greater than about 7.0, and may include a metal oxide or a silicate of Hf, Al, Zr, La, Mg, Ba, Ti, Pb, and combinations thereof. The formation methods of the gate dielectric layer 122 may include Molecular-Beam Deposition (MBD), ALD, PECVD, and the like.

Further, a doping layer 124 is formed over the gate dielectric layer 122. The doping layer 124 may be formed from an oxide, nitride, or carbide of a dipole-inducing element such as Al, Ti, Zr, Hf, Mg, Ge, Y, Lu, La, Sr, Sc, Ru, Er, and combinations thereof. The doping layer 124 may be formed by PVD, CVD, ALD, or other suitable deposition methods. In a particular embodiment, the doping layer 124 is formed from an oxide of La, e.g., LaOx, which induces n-type dipoles for n-type FETs.

Figure 14:
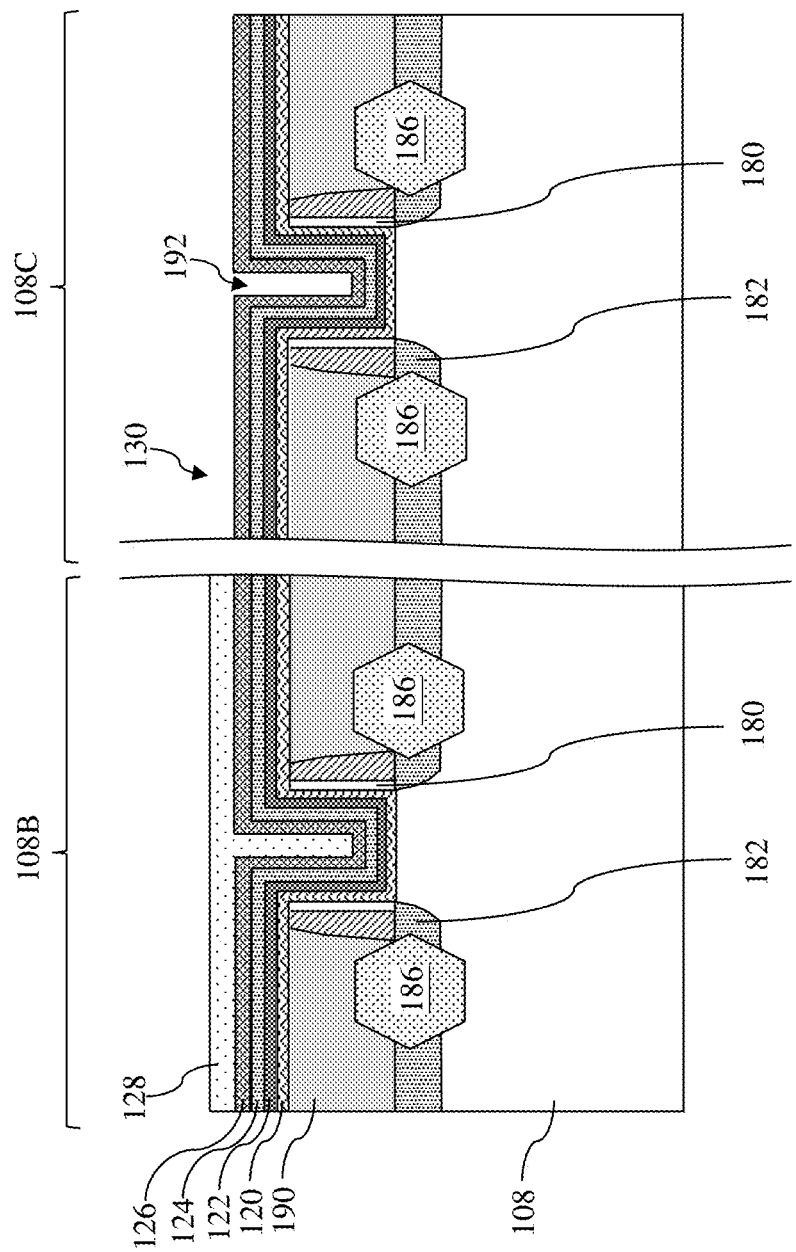

In FIG. 14, a mask layer 126 is formed over the doping layer 124. The mask layer 126 may be formed of a hard masking material, and may include a metal and/or a dielectric. In embodiments where the mask layer 126 includes a metal, it may be formed of titanium nitride, titanium, tantalum nitride, tantalum, aluminum oxide, or the like. In embodiments where the mask layer 126 includes a dielectric, it may be formed of an oxide, a nitride, or the like. The mask layer 126 may be formed by PVD, Radio Frequency PVD (RFPVD), Atomic Layer Deposition (ALD), or the like.

Further, a photoresist 128 is formed over the mask layer 126. The photoresist 128 may be a single-layer photoresist, a tri-layer photoresist, or the like. In an embodiment, the photoresist 128 is a tri-layer photoresist that includes a bottom layer, a middle layer, and an upper layer (not shown). The upper layer may be formed of a photosensitive material, such as a photoresist, which may comprise organic materials. The bottom layer may be a bottom anti-reflective coating (BARC). The middle layer may be formed of or include an inorganic material, which may be a nitride (such as silicon nitride), an oxynitride (such as silicon oxynitride), an oxide (such as silicon oxide), or the like. The middle layer has a high etching selectivity relative to the upper layer and the bottom layer. As a result, the upper layer is used as an etching mask for the patterning of the middle layer, and the middle layer is used as an etching mask for the patterning of the bottom layer.

After formation, the photoresist 128 is patterned using any suitable photolithography technique after formation to form openings 130 exposing the recesses 192 in the region 108C. For example, an etching process including etchants such as $CF_4$, $CH_3F$, $H_2$, $N_2$, Ar, the like, or a combination thereof may be used to remove portions of the photoresist 128 without substantially damaging the mask layer 126. In the embodiment shown, the openings 130 are formed in the region 108C of the fins 108. Gates of the devices formed in the covered region 108B will have a modulated work function. As such, resulting devices in the regions 108B and 108C will have different threshold voltages.

Figure 15:
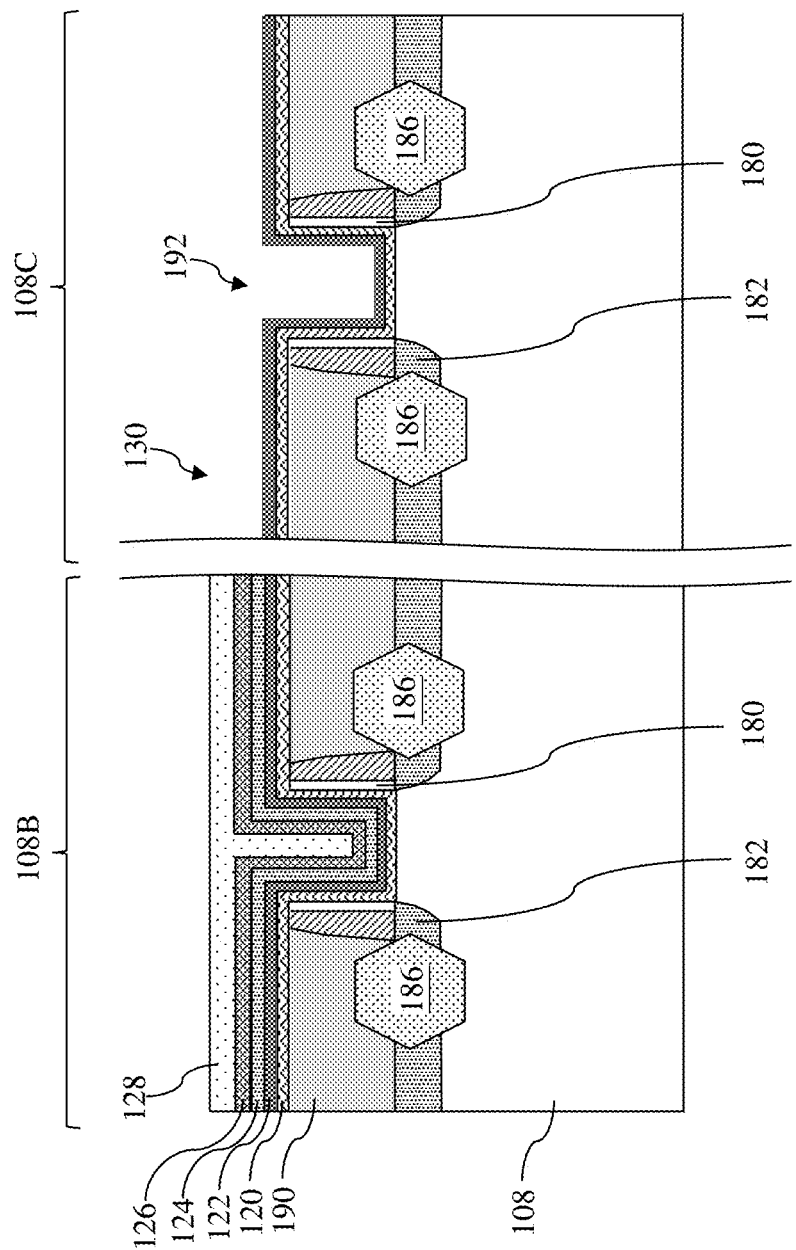

In FIG. 15, a plurality of etching processes are performed to transfer the pattern of the photoresist 128 to the doping layer 124, thereby extending the openings 130 through the doping layer 124. As such, remaining portions of the doping layer 124 are in the regions 108B where the metal gate work functions will be modulated. In an embodiment, one or more wet etching processes are performed using etchants such as an ammonia peroxide mixture (APM), sulfuric acid peroxide mixture (SPM), hydrochloric acid peroxide mixture (HPM), $H_2O_2$, $O_3$, or the like. In an embodiment, a first etching process is performed using a HPM to transfer the pattern of the photoresist 128 to the mask layer 126, and a second etching process is performed using an APM to transfer the pattern of the mask layer 126 to the doping layer 124.

Figure 16:
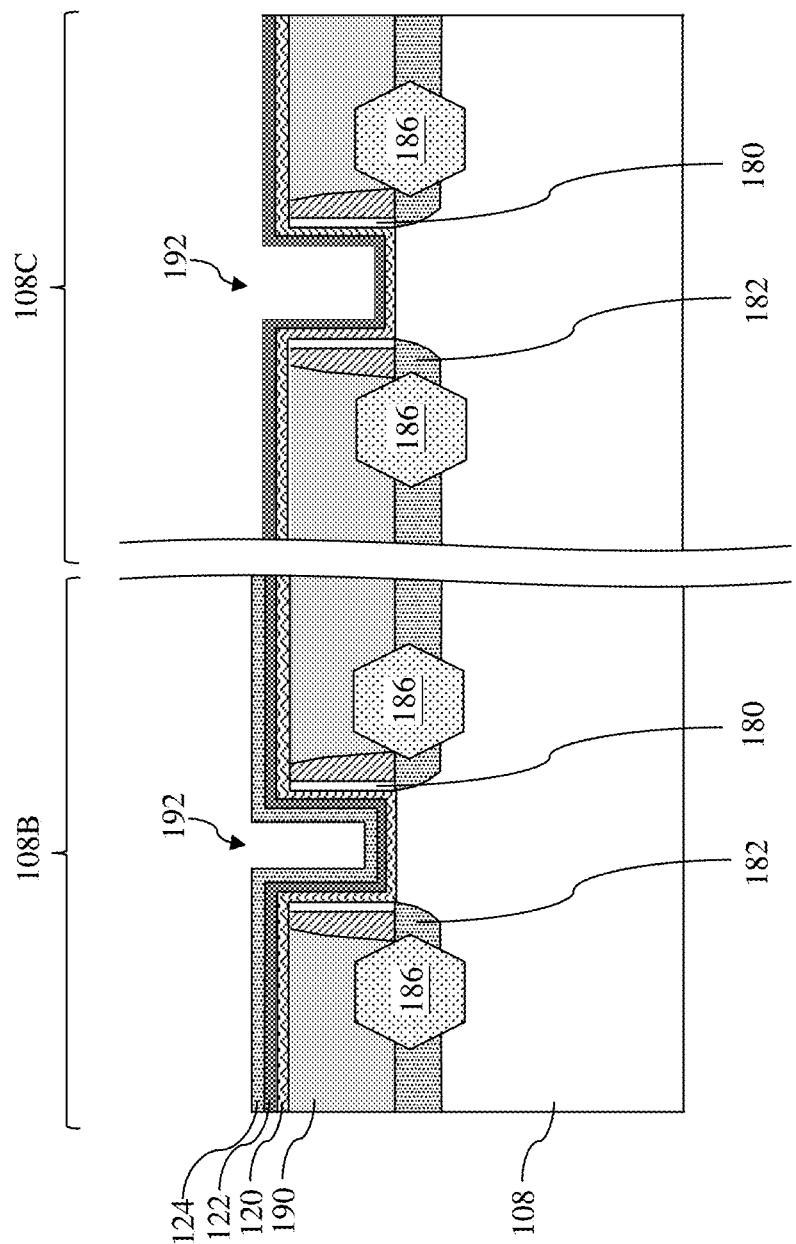

In FIG. 16, remaining portions of the photoresist 128 and mask layer 126 are removed to expose the recesses 192 in the region 108B. The remaining portions of the photoresist 128 may be removed by an acceptable ashing process, and the remaining portions of the mask layer 126 may be removed by repeating the first etching process, e.g., by etching the mask layer 126 with an APM.

Figure 17:
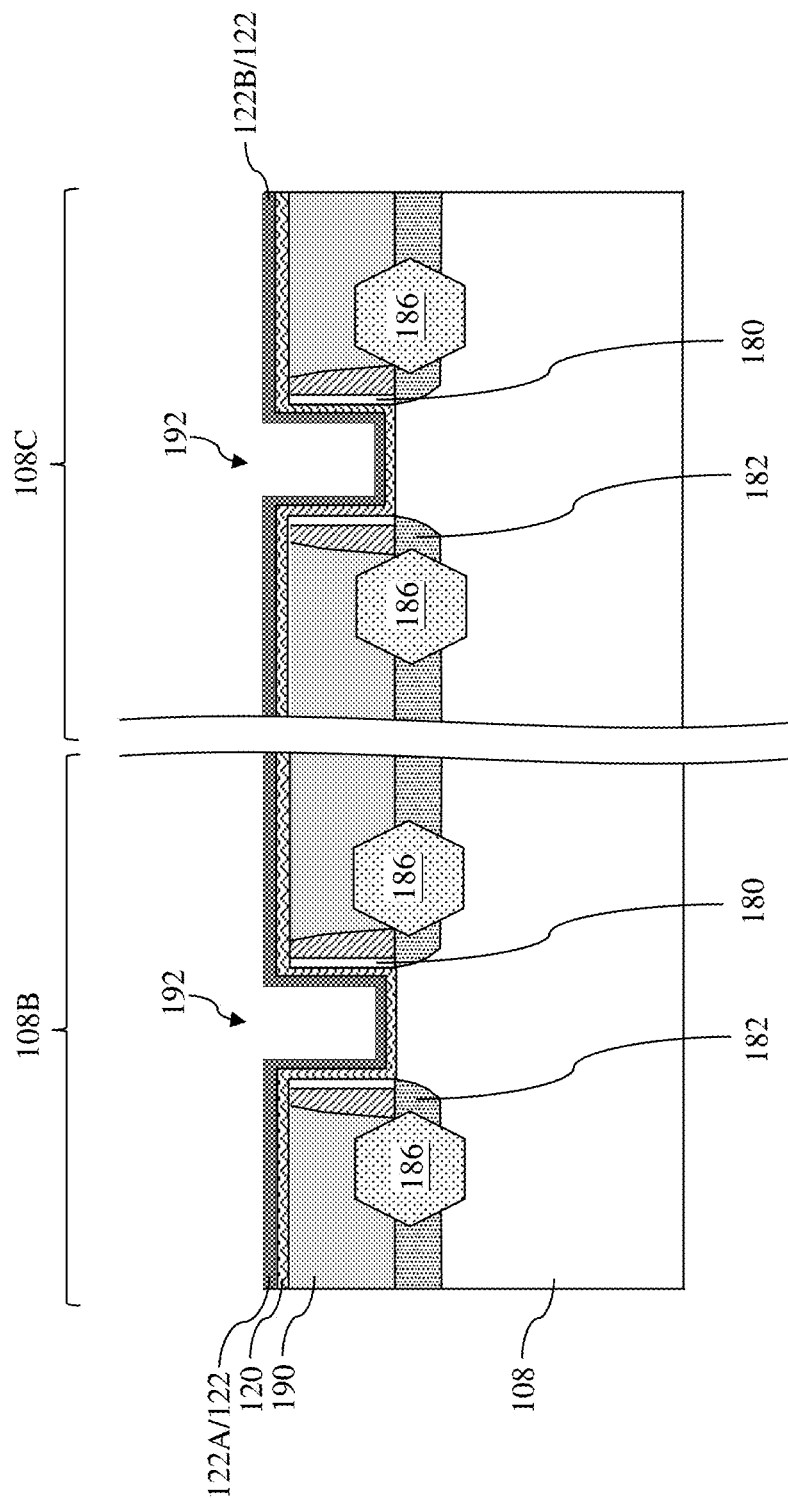

In FIG. 17, an annealing process is performed to drive the dipole-inducing element of the doping layer 124 into and through portions of the gate dielectric layer 122 in the region 108B. The annealing process may be performed at a temperature of from about 550° C. to about 1050° C. The annealing process may be performed for a time period of less than about 5 minutes, and the annealing time may depend on the annealing temperature. It should be appreciated that other annealing processes may be performed at other temperatures and for other time periods. After the annealing process, excess portions of the doping layer 124 are removed. The removal may be accomplished by repeating the second etching process, e.g., by etching the doping layer 124 with a HPM.

During the annealing process, some of the dipole-inducing element of the doping layer 124 is driven into the gate dielectric layer 122. Portions of the gate dielectric layer 122 covered by the doping layer 124 (e.g., in the region 108B) are thus doped with the dipole-inducing element. As such, after the annealing process, first portions 122A of the gate dielectric layer 122 in the region 108B have a higher concentration of the dipole-inducing element than second portions 122B of the gate dielectric layer 122 in the region 108C.

Further, during the annealing process, some of the dipole-inducing element of the doping layer 124 is driven through the gate dielectric layer 122 such that the dipole-inducing element is formed at the interfaces of the gate dielectric layer 122 and interface layer 120 in the region 108B. The dipole-inducing element creates dipole interfaces between the interface layer 120 and gate dielectric layer 122, which may modulate the effective work function of subsequently formed metal gates.

Figure 18:
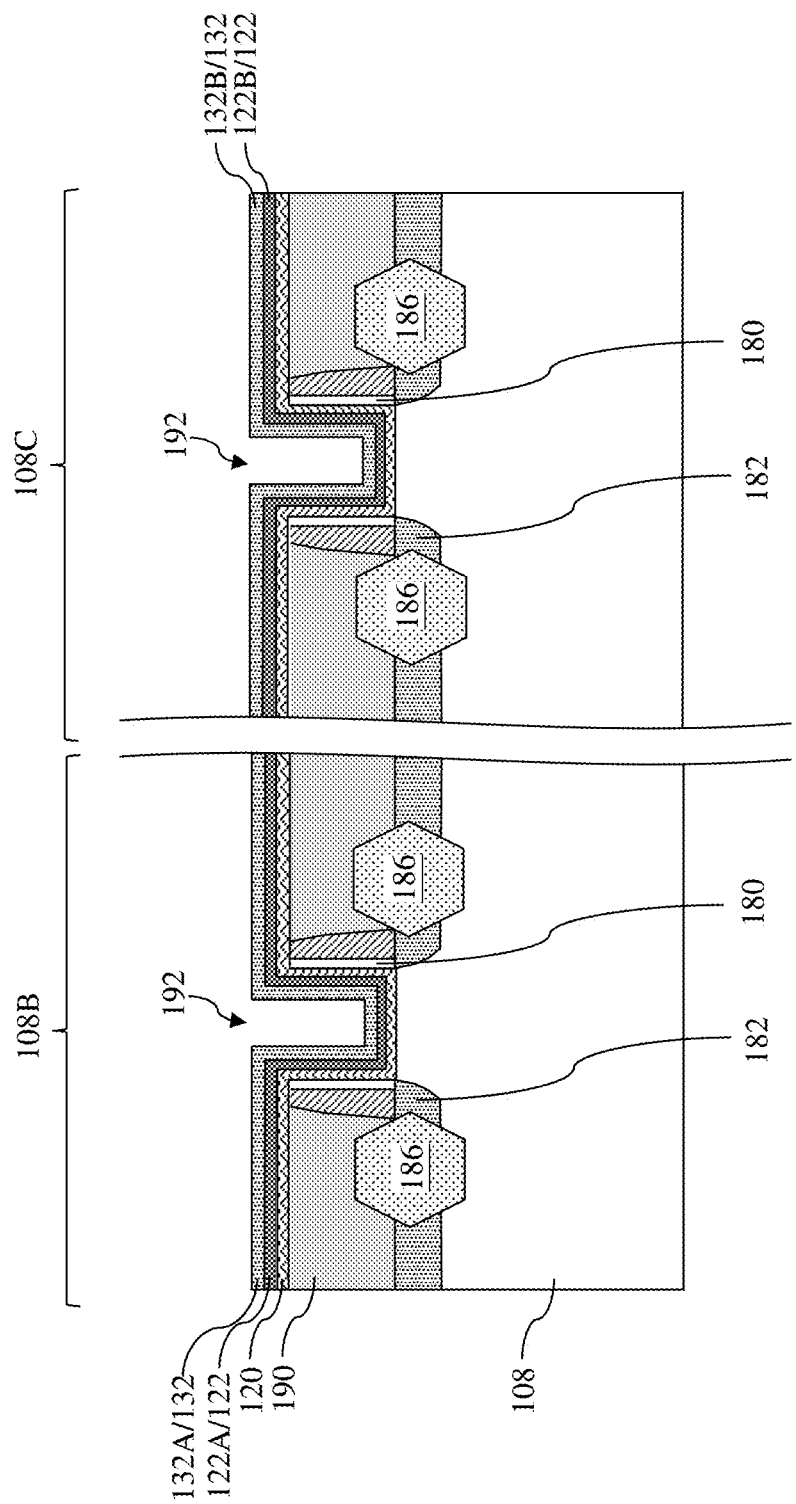

In FIG. 18, a work function metal (WFM) layer 132 is deposited over the gate dielectric layer 122. The WFM layer 132 may be formed separately for n-type and p-type transistors which may use different metal layers. For regions 108B and 108C in the same n-type FET region or p-type FET region, the first portions 132A and the second portions 132B of the WFM layer 132 may be portions of a single WFM layer of the same type across the regions 108B and 108C. For the region 108B in an n-type FET region and the region 108C in a p-type FET region, the first portions 132A of the WFM layer 132 in the region 108B is an n-type WFM layer and the second portions 132B of the WFM layer 132 in the region 108C is a p-type WFM layer. An n-type work function layer may comprise a metal with sufficiently low effective work function, selected from but not restricted to the group of titanium (Ti), aluminum (Al), titanium nitride (TiN), tantalum nitride (TaN), tantalum carbide (TaC), tantalum carbide nitride (TaCN), tantalum silicon nitride (TaSiN), titanium silicon nitride (TiSiN), or combinations thereof. A p-type work function layer may comprise a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. In one embodiment, the first portion 132A includes TiALC and the second portion 132B includes TiN. In some embodiments, each portions 132A and 132B of the WFM layer 132 may include multiple sub-layers, such as a first metal layer and a second metal layer over the first metal layer with different material compositions. The WFM layer 132 may be formed by a deposition process such as ALD or CVD. In an embodiment, the WFM layer 132 is formed to a thickness from about 10 Å to about 100 Å.

Although an etching process is performed to remove the doping layer 124 prior to the deposition of the WFM layer 132, some residual portions of the doping layer 124 may remain even after the removal etching process. In particular, some particles (e.g., residues or atoms) of the dipole-inducing element may remain in top surfaces of the gate dielectric layer 122 in the region 108B. The work function metal at the bottom surface of the WFM layer 132 reacts (e.g., bonds to or interacts) with the dipole-inducing element, resulting in a metal alloy (including metal alloy in nitride or carbide form) thin film disposed between the gate dielectric layer 122 and the WFM layer 132 in the region 108B. The metal alloy thin film includes the dipole-inducing element and may have a thickness from about 1 Å to about 5 Å. In one embodiment, the metal alloy thin film includes La-TiALC. As a comparison, in the region 108C, there is substantially free of dipole-inducing element due to the removal of the doping layer 124 prior to the anneal process and accordingly free of the metal alloy thin film. In an alternative embodiment, the doping layer 124 is sufficiently removed from the region 108B prior to the deposition of the WFM layer 132, such that there is no metal alloy thin film formed in the region 108B.

Figure 19:
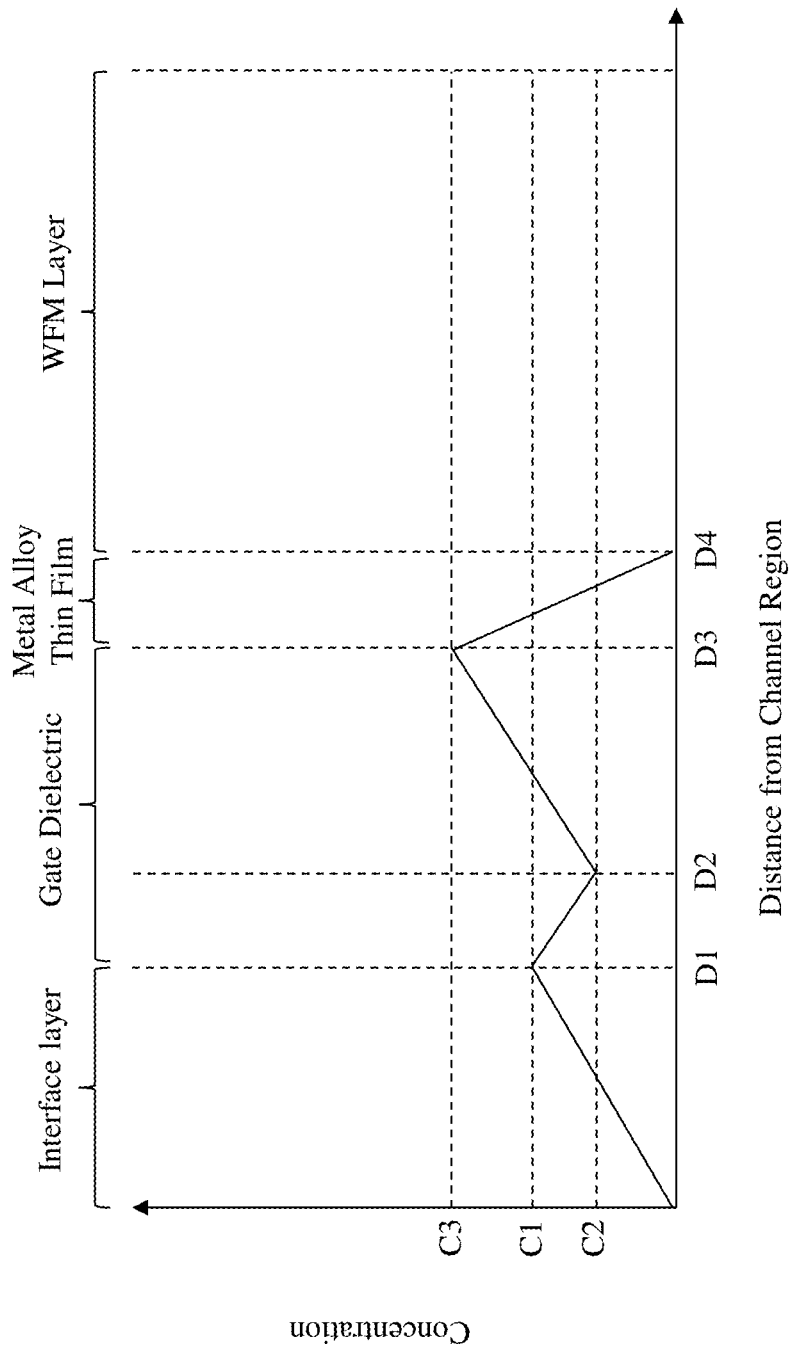
FIG. 19 is a graph illustrating doping concentrations, in accordance with some embodiments.

FIG. 19 is a graph illustrating the concentration of the dipole-inducing element at different distances from the channel regions of the fins 108. As shown, the concentration increases (e.g., has a positive gradient) through the interface layer 120 to a first concentration C1 at a first distance D1. The concentration decreases (e.g., has a negative gradient) through a portion of the gate dielectric layer 122 to a second concentration C2 at a second distance D2, and then begins increasing again through the remaining portions of the gate dielectric layer 122 to a third concentration C3 at a third distance D3. Finally, the concentration decreases through the metal alloy thin film to a fourth distance D4.

Figure 20:
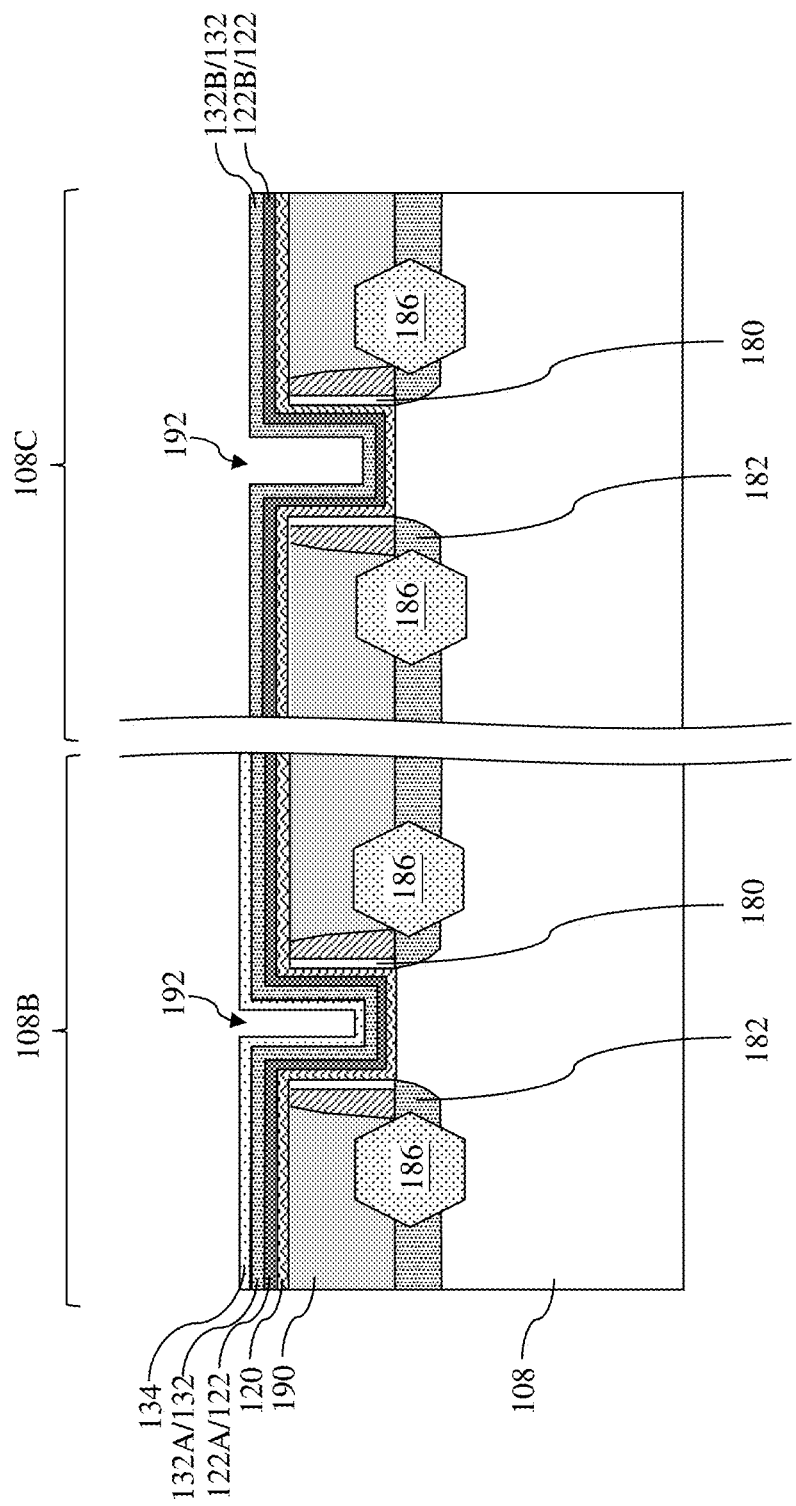

In FIG. 20, an oxygen blocking layer 134 is deposited on the WFM layer 132 in the region 108B. In one embodiment, the oxygen blocking layer 134 is deposited conformally on the WFM layer 132 in both regions 108B and 108C and subsequently removed from the region 108C by a photolithography patterning process. The deposition methods include physical vapor deposition, CVD, ALD, or other suitable methods. The oxygen blocking layer 134 may include material(s) that resists oxygen, such as amorphous silicon (a-Si), LT-TiN, TaN, or combinations thereof, or material(s) that absorbs oxygen, such as titanium aluminum (TiAl), titanium aluminum nitride (TiAlN), or combination thereof. The oxygen blocking layer 134 prevents oxygen in the ambient environment from penetrating through the WFM layer 132 and the gate dielectric layer 122, which expands the threshold voltage turning range by the dipole interfaces. One reason is that the formation of the dipole interfaces is induced by oxygen density gradient at the interface layer 120 and the gate dielectric layer 122. However, oxygen atoms diffusing downward from ambient environment may reduce such oxygen density gradient and affect the dipole interfaces formation. Consequently, the oxygen atoms from ambient environment impairs threshold voltage tuning capability by the dipole interfaces. A thickness of the oxygen blocking layer 134 is selected as a compromise between the layer's oxygen blocking capability and its electric resistance. The oxygen blocking layer 134 may have a thickness ranging from about 3 Å to about 30 Å. A thickness less than 3 Å may not provide sufficient oxygen blocking capability. A thickness larger than 30 Å may introduce higher resistance between the WFM layer 132 and the to-be-formed gate metal fill layer and impair the gate drive performance.

In an example process to form the oxygen blocking layer 134, a metal nitride layer, such as a titanium nitride layer, may be optionally deposited on the WFM layer 132 first using ALD. The ALD deposition of the titanium nitride layer may include use of a titanium-containing precursor, such as tetrakis (dimethylamino) titanium (TDMAT) or titanium tetrachloride (TiCl$_4$), and a nitrogen-containing precursor, such as ammonia (NH$_3$) performed at a first process temperature between about 250° C. and about 400° C. The titanium nitride layer functions as a barrier layer in protecting the WFL layer 132 underneath. In one instance, the oxygen blocking layer 134 is a layer of amorphous silicon in-situ (without breaking vacuum during processes). In some embodiments, the amorphous silicon layer may be deposited by using silicon-containing gases (e.g., SiH$_4$, Si$_2$H$_6$, Si$_3$H$_8$) as precursor gases. The amorphous silicon layer may be deposited, for example, at a flow rate of the silicon-containing gas in the range from about 1000 standard cubic centimeters per minute (sccm) to about 2000 sccm, at a temperature in a range from about 350° C. to about 600° C., at a pressure in a range from about 400 mTorr to about 1 Torr. These process conditions for forming the amorphous silicon layer is intended to be illustrative and is not intended to be limiting to embodiments of the present disclosure. Rather, any suitable processes and associated process conditions may be used. Silicon atoms deposited on the titanium nitride layer in the illustrative process tend to form an amorphous solid (i.e., non-crystalline solid) that lacks the long-range order of a crystal. In another instance, the oxygen blocking layer 134 is a layer of titanium aluminum that is deposited by ALD process using a titanium-containing precursor, such as tetrakis (dimethylamino) titanium (TDMAT) or titanium tetrachloride (TiCl$_4$), and an aluminum-containing precursor, such as tri(tertbutyl) aluminum (TTBA) or triethylaluminum (TEA). In yet another instance, the oxygen blocking layer 134 is a layer of titanium aluminum nitride that is deposited by ALD process using a titanium-containing precursor, such as tetrakis (dimethylamino) titanium (TDMAT) or titanium tetrachloride (TiCl$_4$), an aluminum-containing precursor, such as tri(terbutyl) aluminum (TTBA) or triethylaluminum (TEA), and a nitrogen-containing precursor, such as ammonia (NH$_3$). Since titanium aluminum nitride has better corrosion resistance than titanium aluminum but more brittle and lower strength than titanium aluminum, in some instances, the oxygen blocking layer 134 comprises a multi-layer film stack of a titanium aluminum layer and a titanium aluminum nitride layer thereabove. Alternatively, the multi-layer film stack may comprise an amorphous silicon layer and a titanium aluminum layer thereabove. The combination of two oxygen blocking materials results in improved mechanical, chemical, and electrical properties.

In some instances, the oxygen blocking layer 134 may have a thickness less than about 10 Å and the WFM layer 132 may have a thickness at least six times of the thickness of the oxygen blocking layer 134, such as larger than about 60 Å. Similar to the discussion above, a thickness ratio of the WFM layer 132 over the oxygen blocking layer 134 being larger than 6:1 balances the needs of oxygen blocking and gate driving. Because the oxygen blocking layer 134 is thin and a subsequent process may consume the oxygen blocking layer 134, the introduction of the oxygen blocking layer 134 does not necessarily increase the resistance of the resulting gate structure.

Figure 21:
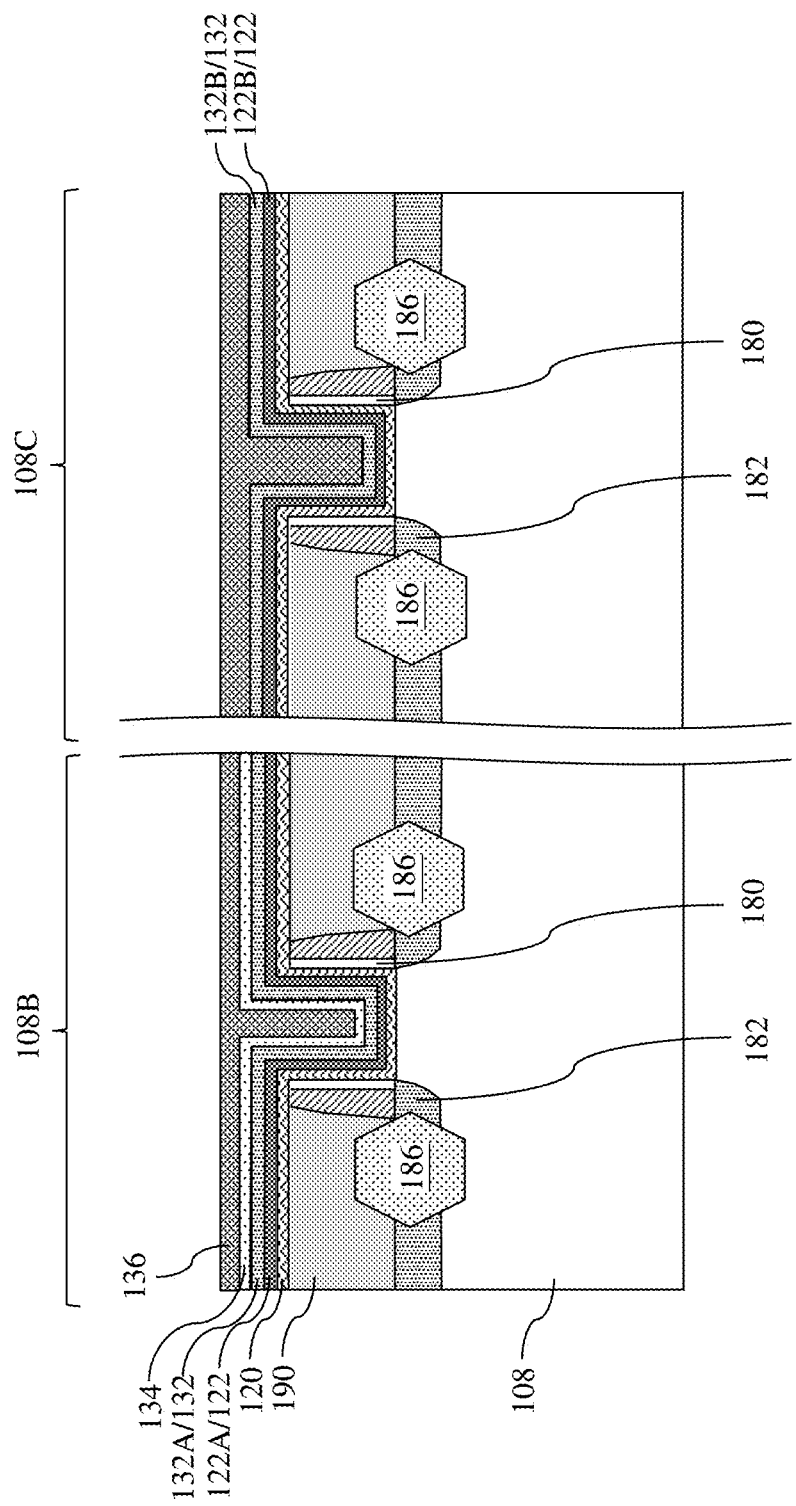

In FIG. 21, a gate metal fill layer 136 is deposited over the oxygen blocking layer 134 and in the recesses 192. The gate metal fill layer 136 may include aluminum (Al), tungsten (W), cobalt (Co), and/or other suitable materials. In various embodiments, the gate metal fill layer 136 may be formed by plating, ALD, PVD, CVD, e-beam evaporation, or other suitable process. Optionally a seal layer (not shown) may first be formed between the oxygen blocking layer 134 and the gate metal fill layer 136 to protect the underneath oxygen blocking layer 134. In furtherance of an embodiment, the seal layer may be in the region 108B but removed from the region 108C in a photolithography patterning process. The seal layer may be formed from TiAl, TiN, TiAlN, silicon-doped TiN (TiSiN), TaN, or other suitable materials, and may be formed by a deposition process such as ALD or CVD. In one example, the seal layer includes titanium nitride deposited using ALD. Although a metal nitride layer formed prior to the oxygen blocking layer 134 may include titanium nitride, the seal layer is at least different from them in terms of grain size. Because the seal layer may benefit from a larger grain size rather than larger grain size, the ALD process to deposit the seal layer includes a second process temperature between about 400° C. and about 500° C. The second process temperature is higher than the first process temperature discussed above. After the deposition of the seal layer, a grain size of metal nitride under the oxygen blocking layer 134 is smaller than a grain size of the metal nitride above the oxygen blocking layer 134. In the instance that the oxygen blocking layer 134 includes amorphous silicon, both top and bottom surfaces of the oxygen blocking layer 134 may form interfaces of metal silicide (e.g., titanium silicide) between the oxygen blocking layer 134 and respective metal nitride layer thereon or thereunder, which are observable such as using tunneling electron microscopy (TEM). The seal layer is formed to a thickness less than that of the oxygen blocking layer 134. If the thickness of the seal layer is larger than that of the oxygen blocking layer 134, gate drive performance may be deteriorated due to large distance between the WFM metal layer 132 and the to-be-formed gate metal fill layer.

After deposition, the seal layer may optionally be annealed. In embodiments where the seal layer is annealed, the annealing process is performed in-situ with the deposition process, e.g., is performed in a same chamber without breaking a vacuum between the deposition and annealing processes. The annealing processes may be performed at a temperature of from about 550° C. to about 1050° C. The annealing process may be performed for a time period of less than about 5 minutes, and the annealing time may depend on the annealing temperature.

Figure 22:
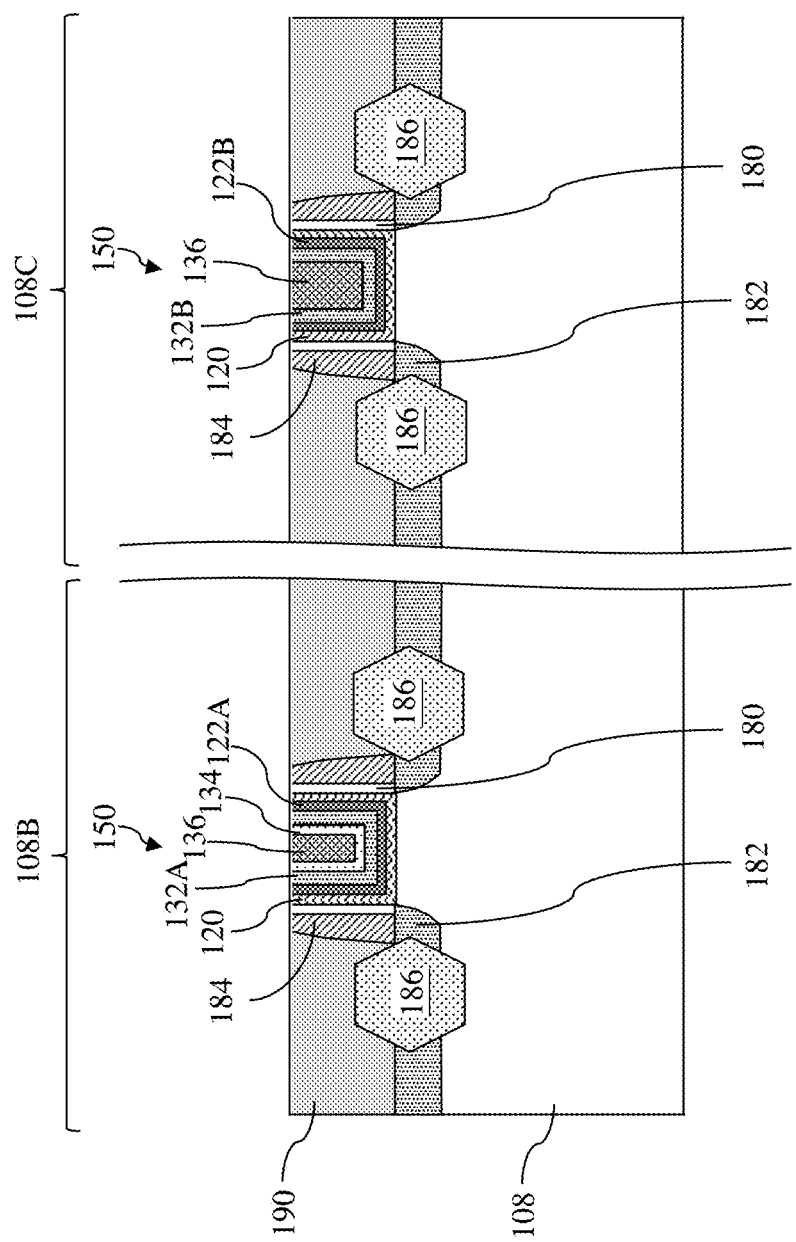

In FIG. 22, a planarization process, such as a CMP, is performed to remove the excess portions of the interface layer 120, gate dielectric layer 122, WFM layer 132, oxygen blocking layer 134, and gate metal fill layer 136, which excess portions are over the top surface of the ILD 190. The remaining portions of the WFM layer 132, oxygen blocking layer 134, and gate metal fill layer 136 form gate electrodes 150, which in combination with the other layers, form replacement gates of the resulting FinFETs. The interface layer 120, gate dielectric layer 122, and gate electrodes 150 may be collectively referred to as the "gates" or "gate stacks" of the resulting FinFETs. The gate stacks may extend along sidewalls of the channel region of the fins 108.

Figure 23:
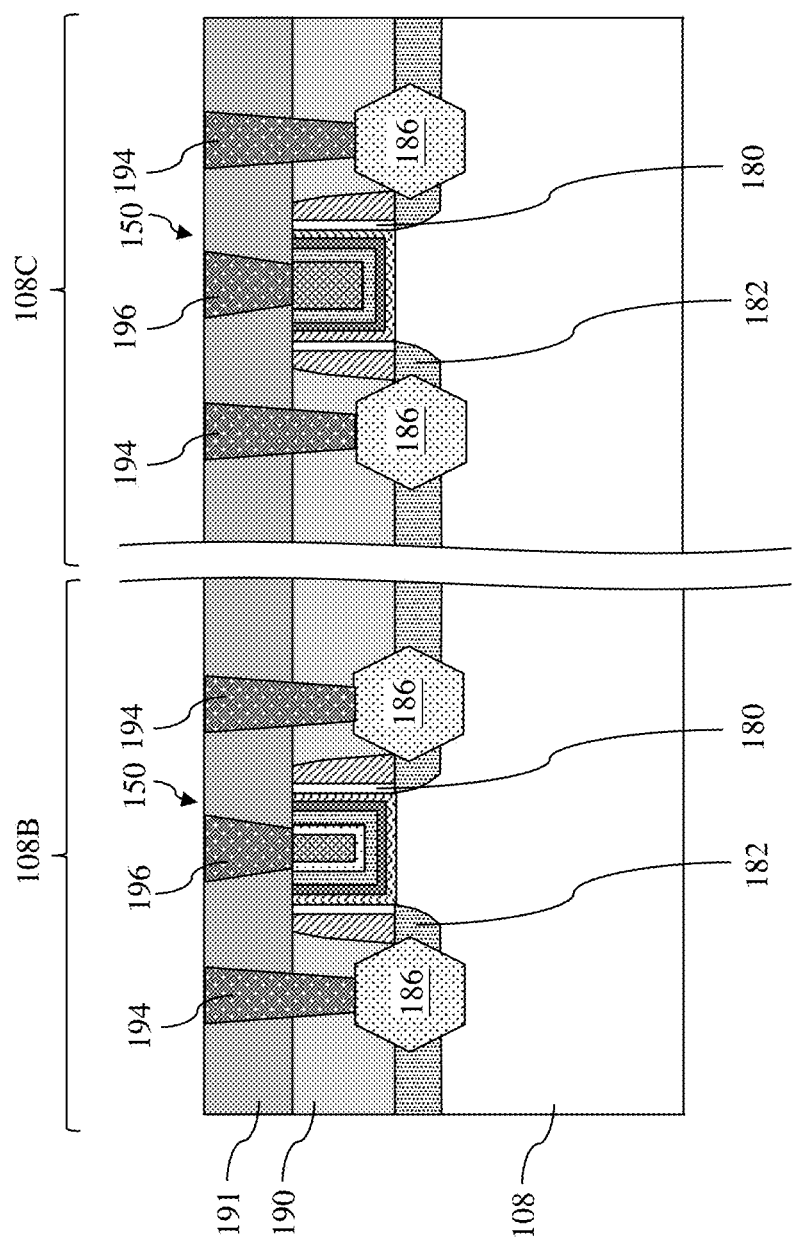

In FIG. 23, an ILD 191 is formed over the gate stacks and ILD 190. In an embodiment, the ILD 191 is a flowable film formed by a flowable CVD method. In some embodiments, the ILD 191 is formed of a dielectric material such as PSG, BSG, BPSG, USG, or the like, and may be deposited by any suitable method, such as CVD and PECVD.

Source/drain contacts 194 and gate contacts 196 are formed through the ILDs 191 and 190. Openings for the source/drain contacts 194 are formed through the ILDs 191 and 190, and openings for the gate contacts 196 are formed through the ILD 191. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 191. The remaining liner and conductive material form the source/drain contacts 194 and gate contacts 196 in the openings. An anneal process may be performed to form a silicide at the interface between the epitaxial source/drain regions 186 and the source/drain contacts 194. The source/drain contacts 194 are physically and electrically coupled to the epitaxial source/drain regions 186, and the gate contacts 196 are physically and electrically coupled to the gate electrodes 150. The source/drain contacts 194 and gate contacts 196 may be formed in different processes, or may be formed in the same process. Although shown as being formed in the same cross-sections, it should be appreciated that each of the source/drain contacts 194 and gate contacts 196 may be formed in different cross-sections, which may avoid shorting of the contacts.

FIGS. 24 through 28 are cross-sectional views of intermediate stages in the manufacturing of FinFETs, in accordance with some other embodiments. FIGS. 24 through 28 illustrate an embodiment where the process for forming the doping layer 124 and driving the dipole-inducing element into the gate dielectric layer 122 is repeated in different regions. Optionally, the dopants may have different concentrations in the different regions. Further, the dopants may be different in the different regions. The process shown in FIGS. 24 through 28 may be performed after the annealing process in driving the dipole-inducing element and the removal of the doping layer 124 in the region 108B (FIG. 17), and before the WFM layer 132 is formed (FIG. 18).

Figure 24:
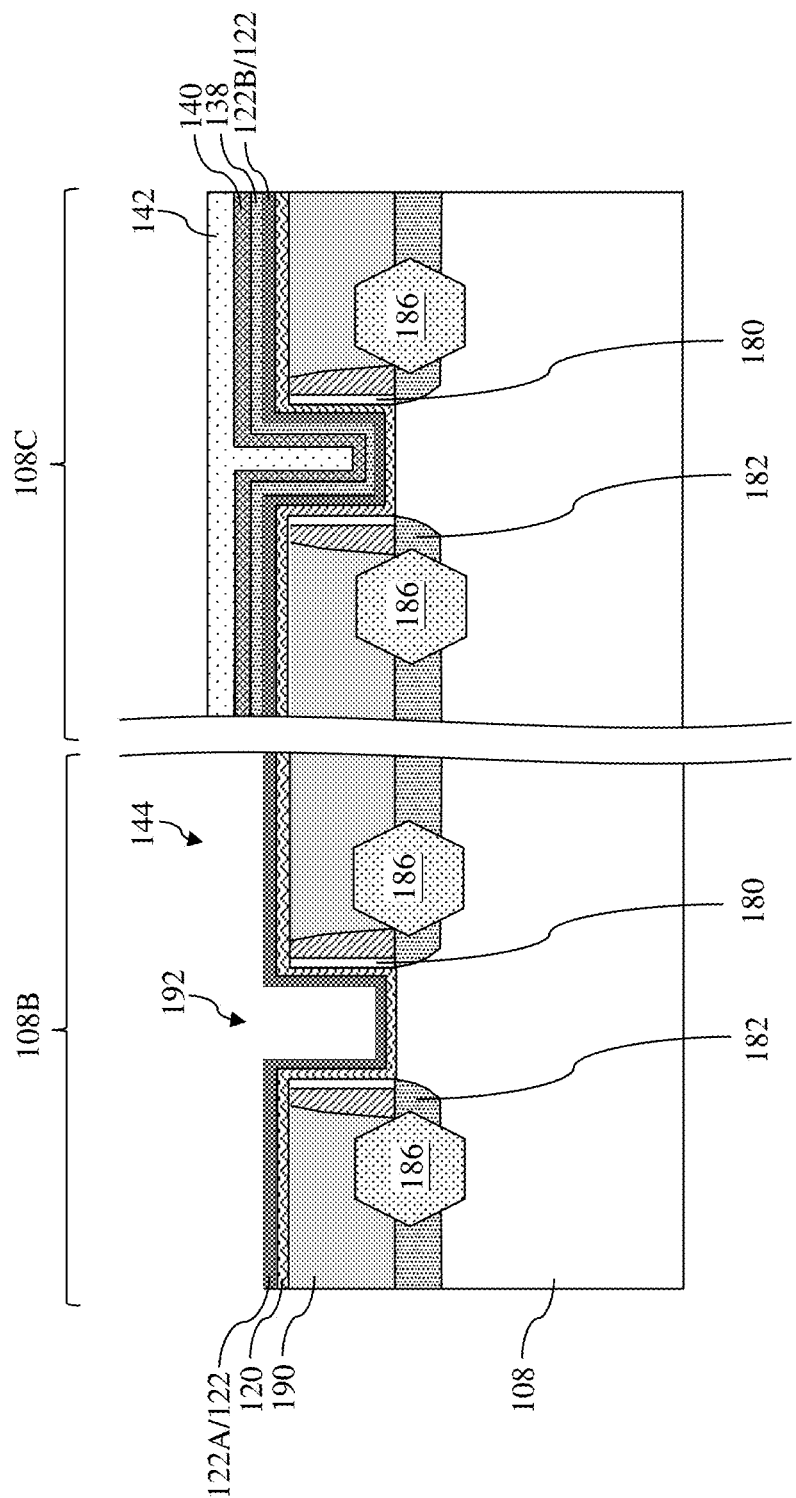
FIGS. 24, 25, 26, 27, and 28 are cross-sectional views of intermediate stages in the manufacturing of FinFETs, in accordance with some other embodiments.

In FIG. 24, a second doping layer 138 is formed over the gate dielectric layer 122. The doping layer 138 may be formed from an oxide, nitride, or carbide of a dipole-inducing element such as Al, Ti, Zr, Hf, Mg, Ge, Y, Lu, La, Sr, Sc, Ru, Er, and combinations thereof. The doping layer 138 may be formed by PVD, CVD, ALD, or other suitable deposition methods. In a particular embodiment, the doping layer 124 is formed from an oxide of La (e.g., $LaO_x$) that induces n-type dipoles for n-type FETs, and the doping layer 138 is formed from an oxide of Zr (e.g., $ZrO_x$) that induces p-type dipoles for p-type FETs. The thickness of the second doping layer 138 may be different from the thickness of the doping layer 124, such that different regions of the gate dielectric layer 122 are doped with different concentrations of the dipole-inducing element. In an embodiment, the doping layer 138 includes the same dipole-inducing element as in the doping layer 124, but with different thicknesses to introduce different doping concentrations. The threshold voltages of the formed FinFET devices vary with the doping concentration.

A second mask layer 140 is formed over the second doping layer 138. The second mask layer 140 may be similar to the mask layer 126. A photoresist 142 is formed over the second mask layer 140. The photoresist 142 may be similar to the photoresist 128, and may be patterned with openings 144 exposing the recesses 192 in the region 108B. A plurality of etching processes are then performed to transfer the pattern of the photoresist 142 to the second doping layer 138. The etching processes may be similar to the etching processes used for patterning the doping layer 124.

Figure 25:
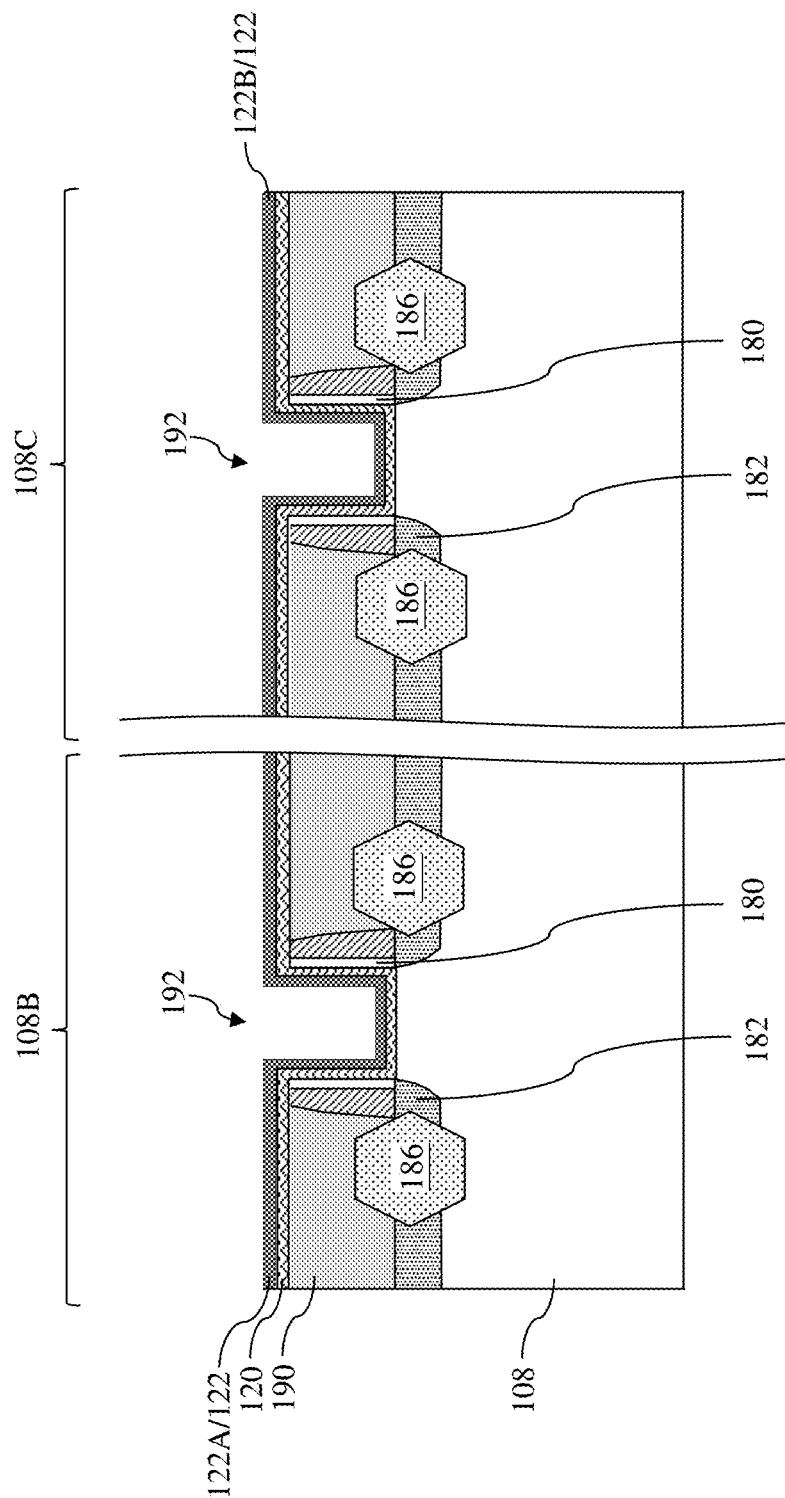

In FIG. 25, an annealing process is performed to drive the dipole-inducing element of the second doping layer 138 into and through portions of the gate dielectric layer 122 in region 108C. Portions of the gate dielectric layer 122 covered by the second doping layer 138 (e.g., in the region 108C) are thus doped with the dipole-inducing element. After the annealing process, the second portions 122B of the gate dielectric layer 122 in the region 108C are thus doped to have a different polarity of dipoles and/or a different concentration of the dipole-inducing element (thus a different concentration of dipoles) than the first portions 122A of the gate dielectric layer 122 in the region 108B.

Figure 26:
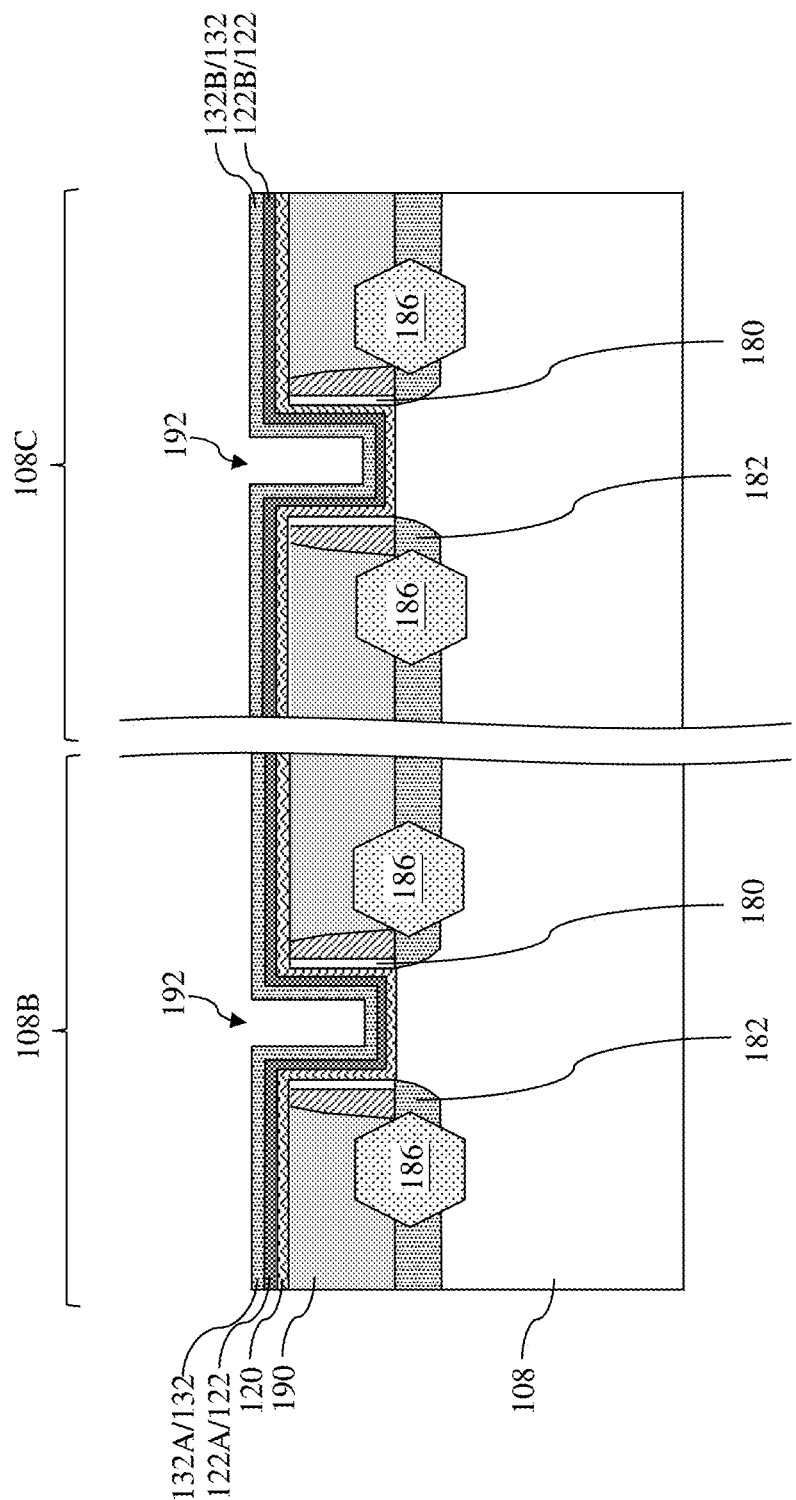

In FIG. 26, a WFM layer 132 is deposited over the gate dielectric layer 122. The WFM layer 132 may be formed separately for n-type and p-type transistors which may use different metal layers. The first portions 132A of the WFM layer 132 in the region 108B may be an n-type WFM layer and the second portions 132B of the WFM layer 132 in the region 108C may be a p-type WFM layer. If some residual portions of the first doping layer 124 and second doping layer 138 may remain, a first metal alloy thin film including the n-type work function metal diffused with the first dipole-inducing element is formed between the gate dielectric layer 122A and the WFM layer 132A in the region 108B, and similarly a second metal alloy thin film including the p-type work function metal diffused with the second dipole-inducing element is formed between the gate dielectric layer 122B and the WFM layer 132B in the region 108C. Alternatively, a single WFM layer 132 is formed across the region 108B and the region 108C, such as an n-type WFM layer or a p-type WFM layer, and the metal alloy thin film across the region 108B and the region 108C includes the same metal materials but different concentrations of the dipole-inducing element.

Figure 27:
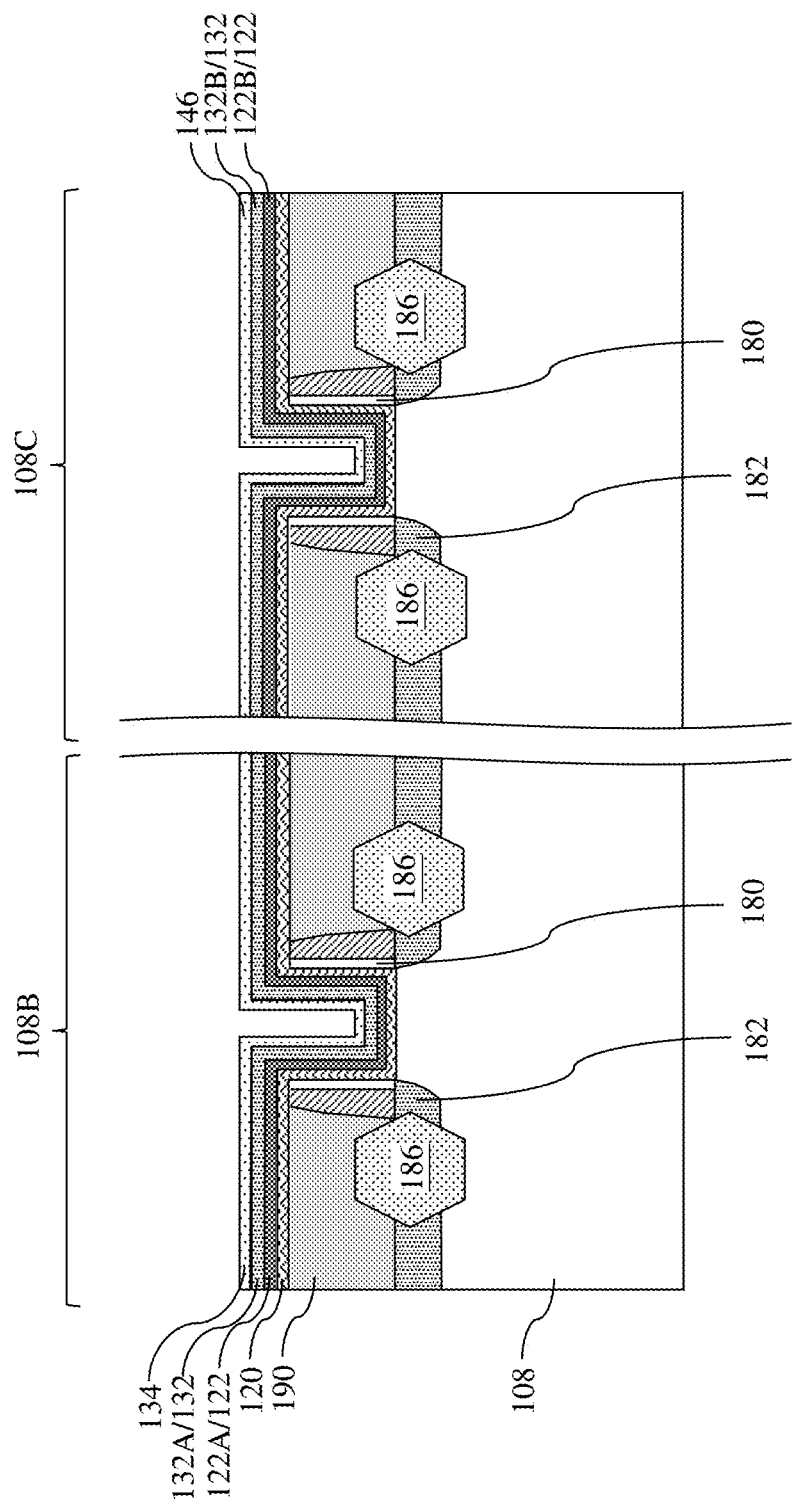

In FIG. 27, an oxygen blocking layer 134 is deposited in the region 108B and an oxygen blocking layer 146 is deposited in the region 108C. As discussed above, a titanium nitride layer may be optionally deposited under the oxygen blocking layers 134 and 146. In some embodiments, the oxygen blocking layer 134 and the oxygen blocking layer 146 are a single oxygen blocking layer formed across the region 102B and region 102C. In a particular embodiment, the oxygen blocking layers 134 and 146 are amorphous silicon with a thickness ranging from about 3 Å to about 30 Å. In some alternative embodiments, the oxygen blocking layer 146 has different material composition and/or thickness from the oxygen blocking layer 134. In a particular embodiment, the oxygen blocking layer 134 is amorphous silicon and the oxygen blocking layer 146 is tantalum nitride with a larger thickness than that of the oxygen blocking layer 134.

Figure 28:
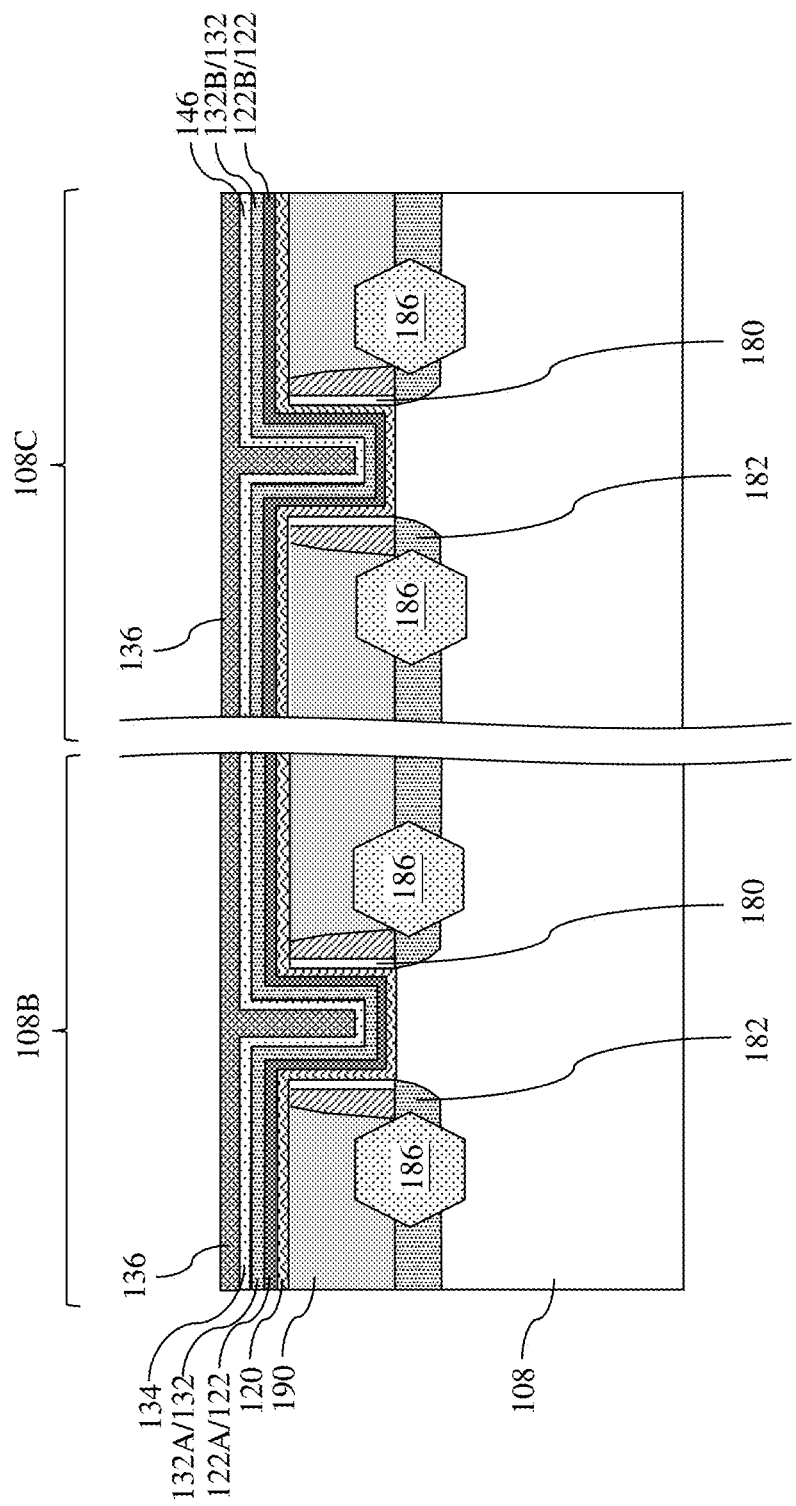

In FIG. 28, a gate metal fill layer 136 is deposited over the oxygen blocking layer 134 and the oxygen blocking layer 146. optionally a seal layer (not shown) may be formed between the oxygen blocking layers and the gate metal fill layer 136 to protect the underneath oxygen blocking layers 134 and 146. As discussed above, the seal layer may include larger grain size of metal nitride (e.g., titanium nitride) than that in the metal nitride layer formed prior to the oxygen blocking layers 134 and 146. After the gate metal fill layer 136 is formed, processing may be continued as described above to form FinFET devices.

It should be appreciated that the doping parameters may be varied. Further, it should be appreciated that no dipole doping may be performed in some regions. For example, the gate dielectric layer 122 in a first region (e.g., region 108B) may have a first dopant concentration of the dipole-inducing element and may have a first threshold voltage; the gate dielectric layer 122 in a second region (e.g., region 108C) may have a second dopant concentration of the dipole-inducing element and may have a second threshold voltage; and the gate dielectric layer 122 in a third region (not shown) may be free from the dipole-inducing element and may have a third threshold voltage. Further, the gate dielectric layer 122 in different regions may be doped with different dipole-inducing elements to have different polarities of dipoles for respective n-type and p-type FETs. Still further, it should be appreciated that the different regions may be in a same fin 108 (as illustrated herein), or in different fins 108 (not shown). In embodiments where the different regions are in different fins 108, the gate dielectric layer 122 that is doped may span multiple fins 108.

Figure 29:
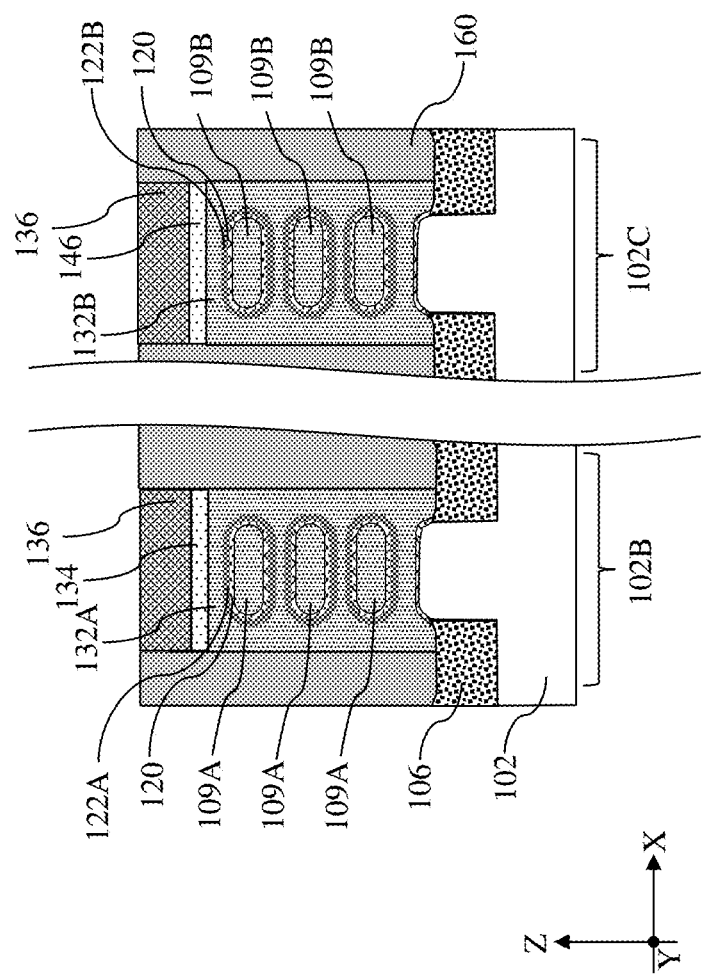
FIG. 29 is a cross-sectional view of an intermediate stage in the manufacturing of a gate-all-around (GAA) transistor, in accordance with some other embodiments.

An alternative embodiment contemplating aspects used in other types of multi-gate devices, particularly gate-all-around (GAA) transistors, is illustrated in FIG. 29. For reasons of clarity and consistency, similar elements appearing in FIGS. 1-28 are labeled the same in FIG. 29. In FIG. 29, a first plurality of channel members 109A are formed over the region 102B of the substrate 102 and a second plurality of channel members 109B are formed over the region 102C of the substrate 102. As discussed above, the region 102B can be for forming n-type devices, such as NMOS transistors, e.g., n-type GAA FETs, and the region 102C can be for forming p-type devices, such as PMOS transistors, e.g., p-type GAA FETs. The region 102B may be physically separated from the region 102C (as illustrated by a divider), and any number of device features (e.g., other active devices, doped regions, isolation structures, etc.) may be disposed between the region 102B and the region 102C. In some embodiments, both the region 102B and the region 102C are used to form the same type of devices, such as both regions being for n-type devices or p-type devices. Depending on the design, each of the first plurality of channel members 109A and the second plurality of channel members 109B may be a nanostructure of different shapes, such as a nanosheet with its width greater than its thickness or a nanowire with its width substantially similar to its thickness.

The first plurality of channel members 109A and the second plurality of channel members 109B are sandwiched between adjacent dielectric fins 160, which are disposed on the STI regions 106. In some embodiments, the dielectric fins 160 include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

In the region 102B, an interface layer 120 wraps around each of the channel members 109A and a first gate dielectric layer 122A wraps around the interface layer 120. The first gate dielectric layer 122A is doped with a first dipole-inducing element, such as La. A first WFM layer 132A, such as an n-type WFM layer, wraps around the first gate dielectric layer 122A. A first oxygen blocking layer 134 is deposited on the first WFM layer 132A. A titanium nitride layer may optionally be formed between the first WFM layer 132A and the first oxygen blocking layer 134. A gate metal fill layer 136 is disposed on the first oxygen blocking layer 134. A seal layer, such as a metal nitride layer, may be optionally formed between the first oxygen blocking layer 134 and the gate metal fill layer 136.

In the region 102C, an interface layer 120 wraps around each of the channel members 109B and a second gate dielectric layer 122B wraps around the interface layer 120. The second gate dielectric layer 122B is doped with a second dipole-inducing element, such as Zr. In one instance, the first dipole-inducing element and the second dipole-inducing element provide dipoles of opposite polarities. In another instance, the first dipole-inducing element and the second dipole-inducing element provide dipoles of the same polarities but with different concentrations. A second WFM layer 132B, such as a p-type WFM layer, wraps around the second gate dielectric layer 122B. A second oxygen blocking layer 146 is deposited on the second WFM layer 132B. A titanium nitride layer may optionally be formed between the second WFM layer 132B and the second oxygen blocking layer 146. A gate metal fill layer 136 is disposed on the second oxygen blocking layer 146. A seal layer, such as a metal nitride layer, may be optionally formed between the second oxygen blocking layer 146 and the gate metal fill layer 136. In yet another alternative embodiment, the second gate dielectric layer 122B may be substantially free of dipole-inducing element, and there needs no a second oxygen blocking layer 146. In other words, the gate metal fill layer 136 may be directly deposited on the second WFM layer 132B in the region 102C, while the first oxygen blocking layer 134 still provides oxygen blocking function in the region 102B.

Embodiments may achieve advantages. Driving dipole-inducing elements into the gate dielectric layer forms dipoles between the interface layer and gate dielectric layer, which may modulate the effective work function of the gate electrodes, allowing gate electrodes with different threshold voltages to be created in different regions. Further, oxygen blocking layers prevent oxygen from diffusing through work function metal layers into dipole interfaces and deteriorating dipole formation, which in turn preserves the integrity of the dipole interfaces and expands threshold voltage turning range.

In one exemplary aspect, the present disclosure is directed to a semiconductor device. The semiconductor device includes an interface layer on a substrate, a gate dielectric layer on the interface layer, a first interface between the interface layer and the gate dielectric layer having a first concentration of a dipole-inducing element. The semiconductor device also includes a work function metal layer on the gate dielectric layer, an oxygen blocking layer on the work function metal layer, and a metal fill layer on the oxygen blocking layer. In some embodiments, the oxygen blocking layer includes amorphous silicon. In some embodiments, the oxygen blocking layer has a thickness ranging from about 3 Å to about 30 Å. In some embodiments, a ratio of a thickness of the work function metal layer over a thickness of the oxygen blocking layer is larger than 6:1. In some embodiments, the work function metal layer is an n-type work function metal layer and the dipole-inducing element is La. In some embodiments, the work function metal layer is a p-type work function metal layer and the dipole-inducing element is Zr. In some embodiments, the semiconductor device further includes a metal alloy thin film between the gate dielectric layer and the work function metal layer, a second interface between the gate dielectric layer and the metal alloy thin film having a second concentration of the dipole-inducing element that is larger than the first concentration. In some embodiments, a third interface between the metal alloy thin film and the work function metal layer is substantially free of the dipole-inducing element. In some embodiments, the semiconductor device further includes a seal layer between the oxygen blocking layer and the metal fill layer. In some embodiments, the seal layer has a thickness less than that of the oxygen blocking layer.

In another exemplary aspect, the present disclosure is directed to a semiconductor device. The semiconductor device includes a substrate, a first transistor, and a second transistor. The first transistor includes a first interface layer on the substrate, a first gate dielectric layer on the first interface layer, a first interface between the first interface layer and the first gate dielectric layer having a first concentration of a first dipole-inducing element, a first work function metal layer on the first gate dielectric layer, and a first oxygen blocking layer on the first work function metal layer. The second transistor includes a second interface layer on the substrate, a second gate dielectric layer on the second interface layer, a second interface between the second interface layer and the second gate dielectric layer having a second concentration of a second dipole-inducing element, and the second concentration being different from the first concentration, a second work function metal layer on the second gate dielectric layer, and a second oxygen blocking layer on the second work function metal layer. In some embodiments, the first and second transistors are of a same conductivity type, and the first dipole-inducing element and the second dipole-inducing element are of a same metal element. In some embodiments, the first and second transistors are of opposite conductivity types, and the first dipole-inducing element and the second dipole-inducing element are different. In some embodiments, the first transistor is an n-type transistor and the first dipole-inducing element is La, and the second transistor is a p-type transistor and the second dipole-inducing element is Zr. In some embodiments, the first oxygen blocking layer and the second oxygen blocking layer are parts of a single oxygen blocking layer across the first and second transistors. In some embodiments, the single oxygen blocking layer is an amorphous silicon layer. In some embodiments, the first oxygen blocking layer and the second oxygen blocking layer include different material compositions.

In another exemplary aspect, the present disclosure is directed to a method. The method includes depositing an interface layer on a substrate, depositing a gate dielectric layer on the interface layer, forming a doping layer on the gate dielectric layer, the doping layer comprising a dipole-inducing element, annealing the doping layer to drive the dipole-inducing element through the gate dielectric layer, removing the doping layer, forming a work function metal layer on the gate dielectric layer, depositing an oxygen blocking layer on the work function metal layer, and forming a gate metal fill layer on the oxygen blocking layer. In some embodiments, the oxygen blocking layer comprises amorphous silicon. In some embodiments, the oxygen blocking layer has a thickness ranging from about 3 Å to about 30 Å.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   an interface layer on a substrate;
   a gate dielectric layer on the interface layer, wherein a first interface between the interface layer and the gate dielectric layer has a first concentration of a dipole-inducing element;
   a work function metal layer on the gate dielectric layer;
   a metal alloy thin film between the gate dielectric layer and the work function metal layer, wherein a second interface between the gate dielectric layer and the metal alloy thin film has a second concentration of the dipole-inducing element;
   an oxygen blocking layer on the work function metal layer; and
   a metal fill layer on the oxygen blocking layer.

2. The semiconductor device of claim 1, wherein the oxygen blocking layer includes amorphous silicon.

3. The semiconductor device of claim 1, wherein the oxygen blocking layer has a thickness ranging from about 3 Å to about 30 Å.

4. The semiconductor device of claim 1, wherein a ratio of a thickness of the work function metal layer over a thickness of the oxygen blocking layer is larger than 6:1.

5. The semiconductor device of claim 1, wherein the work function metal layer is an n-type work function metal layer and the dipole-inducing element is La.

6. The semiconductor device of claim 1, wherein the work function metal layer is a p-type work function metal layer and the dipole-inducing element is Zr.

7. The semiconductor device of claim 1, wherein the second concentration of the dipole-inducing element is larger than the first concentration.

8. The semiconductor device of claim 7, wherein a third interface between the metal alloy thin film and the work function metal layer is substantially free of the dipole-inducing element.

9. The semiconductor device of claim 1, further comprising:
   a seal layer between the oxygen blocking layer and the metal fill layer.

10. The semiconductor device of claim 9, wherein the seal layer has a thickness less than that of the oxygen blocking layer.

11. A semiconductor device comprising:
    a substrate;
    a first transistor comprising:
       a first interface layer on the substrate;
       a first gate dielectric layer on the first interface layer, wherein a first interface between the first interface layer and the first gate dielectric layer has a first concentration of a first dipole-inducing element;
       a first work function metal layer on the first gate dielectric layer; and
       a first oxygen blocking layer on the first work function metal layer; and
    a second transistor comprising:
       a second interface layer on the substrate;
       a second gate dielectric layer on the second interface layer, wherein a second interface between the second interface layer and the second gate dielectric layer has a second concentration of a second dipole-inducing element, and wherein the second concentration is different from the first concentration;
       a second work function metal layer on the second gate dielectric layer; and
       a second oxygen blocking layer on the second work function metal layer,
    wherein the first and second transistors are of opposite conductivity types, and wherein the first dipole-inducing element and the second dipole-inducing element are different.

12. The semiconductor device of claim 11, wherein the first transistor is an n-type transistor and the first dipole-inducing element is La, and wherein the second transistor is a p-type transistor and the second dipole-inducing element is Zr.

13. The semiconductor device of claim 11, wherein the first oxygen blocking layer and the second oxygen blocking layer are parts of a single oxygen blocking layer across the first and second transistors.

14. The semiconductor device of claim 13, wherein the single oxygen blocking layer is an amorphous silicon layer.

15. The semiconductor device of claim 11, wherein the first oxygen blocking layer and the second oxygen blocking layer include different material compositions.

16. A semiconductor device comprising:
    an interface layer on a substrate;
    a gate dielectric layer overlying and in physical contact with the interface layer, wherein a first interface between the interface layer and the gate dielectric layer has a first concentration of a dipole-inducing element;
    a metal alloy thin film overlying and in physical contact with the gate dielectric layer, wherein a second interface between the gate dielectric layer and the metal alloy thin film has a second concentration of the dipole-inducing element that is larger than the first concentration;
    a work function metal layer overlying and in physical contact with the metal alloy thin film;
    an oxygen blocking layer overlying and in physical contact with the work function metal layer; and
    a metal fill layer overlying and in physical contact with the oxygen blocking layer.

17. The semiconductor device of claim 16, wherein a third interface between the metal alloy thin film and the work function metal layer is substantially free of the dipole-inducing element.

18. The semiconductor device of claim 16, wherein the oxygen blocking layer comprises amorphous silicon.

19. The semiconductor device of claim 16, wherein a ratio of a thickness of the work function metal layer over a thickness of the oxygen blocking layer is larger than 6:1.

20. The semiconductor device of claim 11, wherein each of the first and second oxygen blocking layers has a thickness ranging from about 3 Å to about 30 Å.

* * * * *